(12) United States Patent
Bomberger et al.

(10) Patent No.: US 12,159,901 B2
(45) Date of Patent: *Dec. 3, 2024

(54) GATE-ALL-AROUND INTEGRATED CIRCUIT STRUCTURES HAVING SOURCE OR DRAIN STRUCTURES WITH EPITAXIAL NUBS

(71) Applicant: Intel Corporation, Santa Clara, CA (US)

(72) Inventors: Cory Bomberger, Portland, OR (US); Anand Murthy, Portland, OR (US); Mark T. Bohr, Aloha, OR (US); Tahir Ghani, Portland, OR (US); Biswajeet Guha, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/982,459

(22) Filed: Nov. 7, 2022

(65) Prior Publication Data
US 2023/0058558 A1   Feb. 23, 2023

Related U.S. Application Data

(63) Continuation of application No. 16/361,861, filed on Mar. 22, 2019, now Pat. No. 11,522,048.

(51) Int. Cl.
*H01L 29/08* (2006.01)
*H01L 29/417* (2006.01)
(Continued)

(52) U.S. Cl.
CPC .... *H01L 29/0847* (2013.01); *H01L 29/41791* (2013.01); *H01L 29/42392* (2013.01);
(Continued)

(58) Field of Classification Search
CPC .......... H01L 29/0847; H01L 29/41791; H01L 29/42392; H01L 29/6653; H01L 29/66545;
(Continued)

(56) References Cited

U.S. PATENT DOCUMENTS 10,192,867 B1   1/2019   Frougier
11,522,048 B2 *  12/2022  Bomberger ......... H01L 29/7853
(Continued)

OTHER PUBLICATIONS

Office Action from Taiwan Patent Application No. 109104706, mailed May 8, 2024, 15 pgs.

*Primary Examiner* — Tong-Ho Kim
(74) *Attorney, Agent, or Firm* — Schwabe, Williamson & Wyatt, P.C.

(57) ABSTRACT

Gate-all-around integrated circuit structures having source or drain structures with epitaxial nubs, and methods of fabricating gate-all-around integrated circuit structures having source or drain structures with epitaxial nubs, are described. For example, an integrated circuit structure includes a first vertical arrangement of horizontal nanowires and a second vertical arrangement of horizontal nanowires. A first pair of epitaxial source or drain structures includes vertically discrete portions aligned with the first vertical arrangement of horizontal nanowires. A second pair of epitaxial source or drain structures includes vertically discrete portions aligned with the second vertical arrangement of horizontal nanowires. A conductive contact structure is laterally between and in contact with the one of the first pair of epitaxial source or drain structures and the one of the second pair of epitaxial source or drain structures.

20 Claims, 18 Drawing Sheets

(51) Int. Cl.
*H01L 29/423* (2006.01)
*H01L 29/66* (2006.01)
*H01L 29/78* (2006.01)

(52) U.S. Cl.
CPC .... *H01L 29/6653* (2013.01); *H01L 29/66545* (2013.01); *H01L 29/6681* (2013.01); *H01L 29/7853* (2013.01); *H01L 2029/7858* (2013.01)

(58) Field of Classification Search
CPC ............ H01L 29/6681; H01L 29/7853; H01L 2029/7858; H01L 29/0673; H01L 29/1079; H01L 29/42376; H01L 29/66439; H01L 29/161; H01L 29/165; H01L 29/775; H01L 29/7848; H01L 29/78696; H01L 27/088; H01L 21/823412; H01L 21/823418; H01L 21/823431; H01L 21/823437; H01L 21/823475; H01L 27/0886; H01L 29/1033; H01L 29/1037; H01L 29/42356; B82Y 10/00
USPC ......................................................... 257/401
See application file for complete search history.

(56) References Cited

U.S. PATENT DOCUMENTS

| | | | |
|---|---|---|---|
| 2014/0264253 A1* | 9/2014 | Kim | H01L 29/775 |
| | | | 438/514 |
| 2017/0104061 A1 | 4/2017 | Peng | |
| 2018/0374930 A1 | 12/2018 | Bergendahl et al. | |
| 2020/0105871 A1* | 4/2020 | Glass | H01L 29/78654 |
| 2020/0105872 A1* | 4/2020 | Glass | H01L 21/26513 |

* cited by examiner

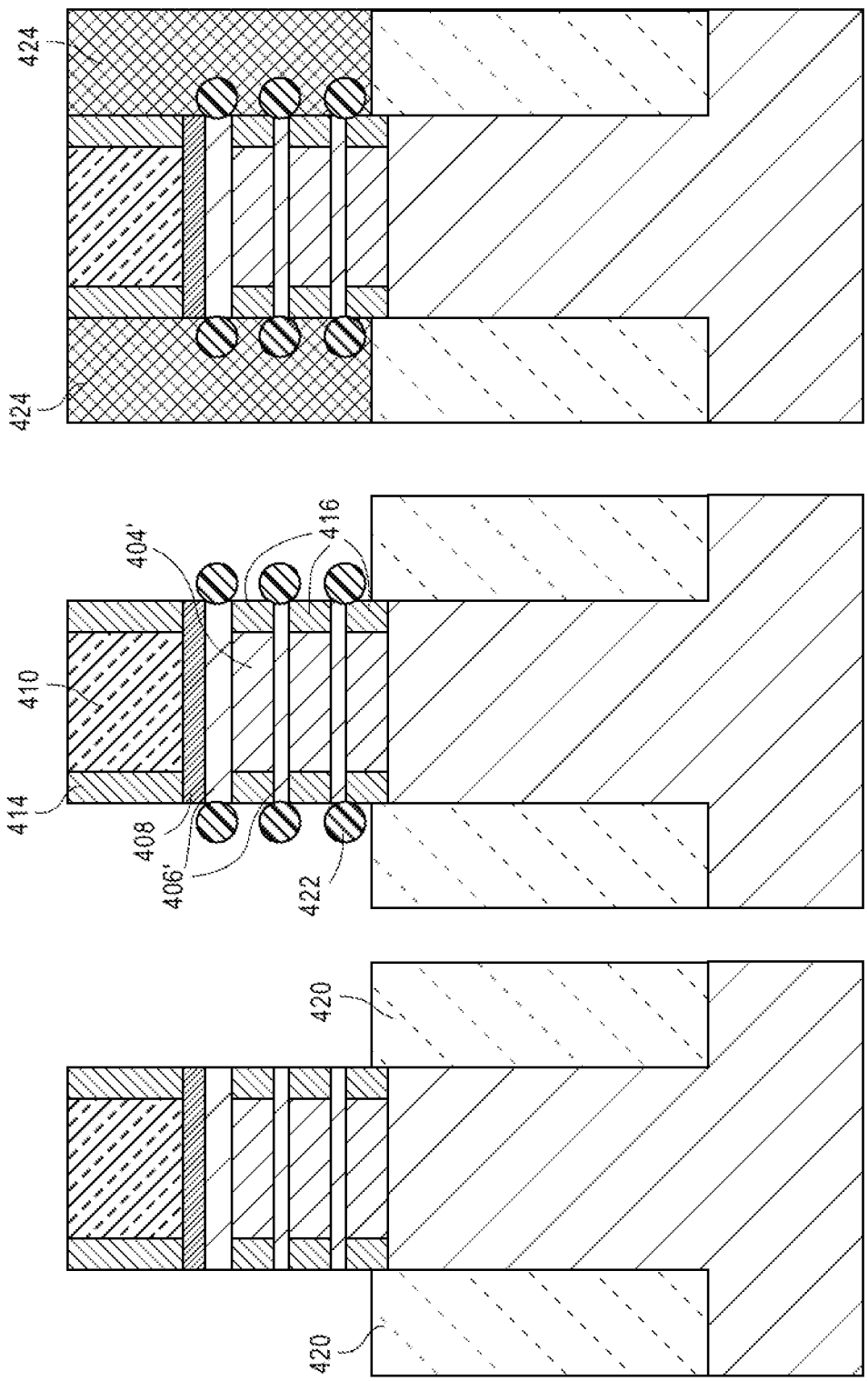

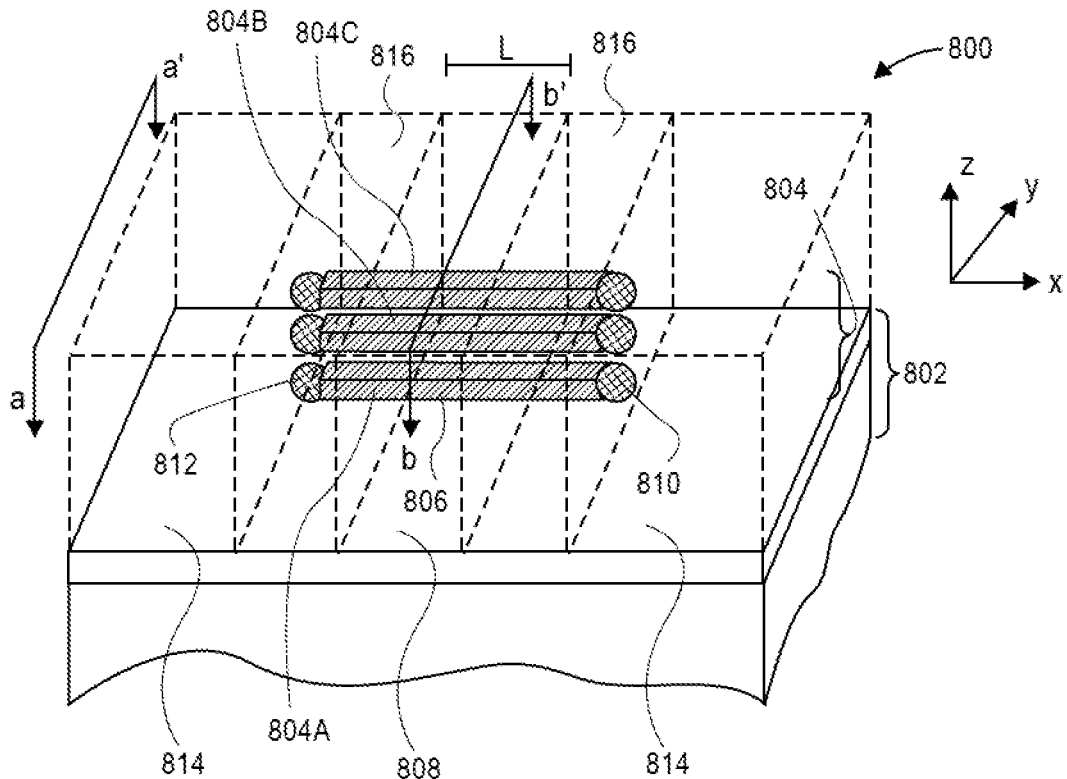
FIG. 8A
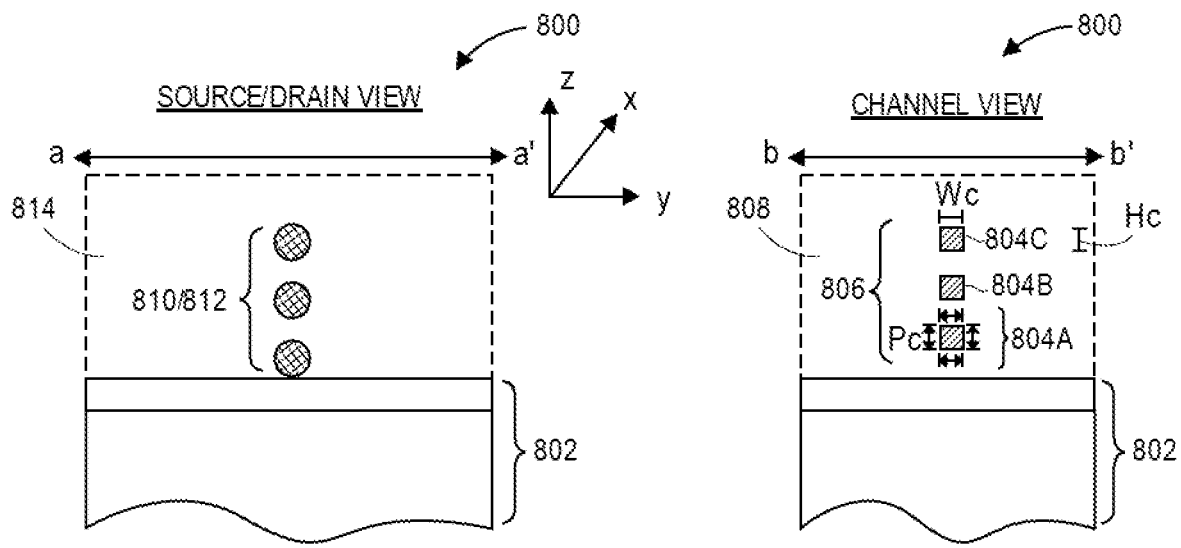
FIG. 8B  FIG. 8C

GATE-ALL-AROUND INTEGRATED CIRCUIT STRUCTURES HAVING SOURCE OR DRAIN STRUCTURES WITH EPITAXIAL NUBS

CROSS-REFERENCE TO RELATED APPLICATIONS

This application is a continuation of U.S. patent application Ser. No. 16/361,861, filed on Mar. 22, 2019, the entire contents of which is hereby incorporated by reference herein.

TECHNICAL FIELD

Embodiments of the disclosure are in the field of integrated circuit structures and processing and, in particular, gate-all-around integrated circuit structures having source or drain structures with epitaxial nubs, and methods of fabricating gate-all-around integrated circuit structures having source or drain structures with epitaxial nubs.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nanowires used to fabricate devices provide improved short channel control.

Scaling multi-gate and nanowire transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

BRIEF DESCRIPTION OF THE DRAWINGS

FIGS. 4A-4J illustrates cross-sectional views of various operations in a method of fabricating a gate-all-around integrated circuit structure, in accordance with an embodiment of the present disclosure.

FIG. 8A illustrates a three-dimensional cross-sectional view of a nanowire-based integrated circuit structure, in accordance with an embodiment of the present disclosure.

FIG. 8B illustrates a cross-sectional source or drain view of the nanowire-based integrated circuit structure of FIG. 8A, as taken along the a-a' axis, in accordance with an embodiment of the present disclosure.

FIG. 8C illustrates a cross-sectional channel view of the nanowire-based integrated circuit structure of FIG. 8A, as taken along the b-b' axis, in accordance with an embodiment of the present disclosure.

DESCRIPTION OF THE EMBODIMENTS

Figure 1:
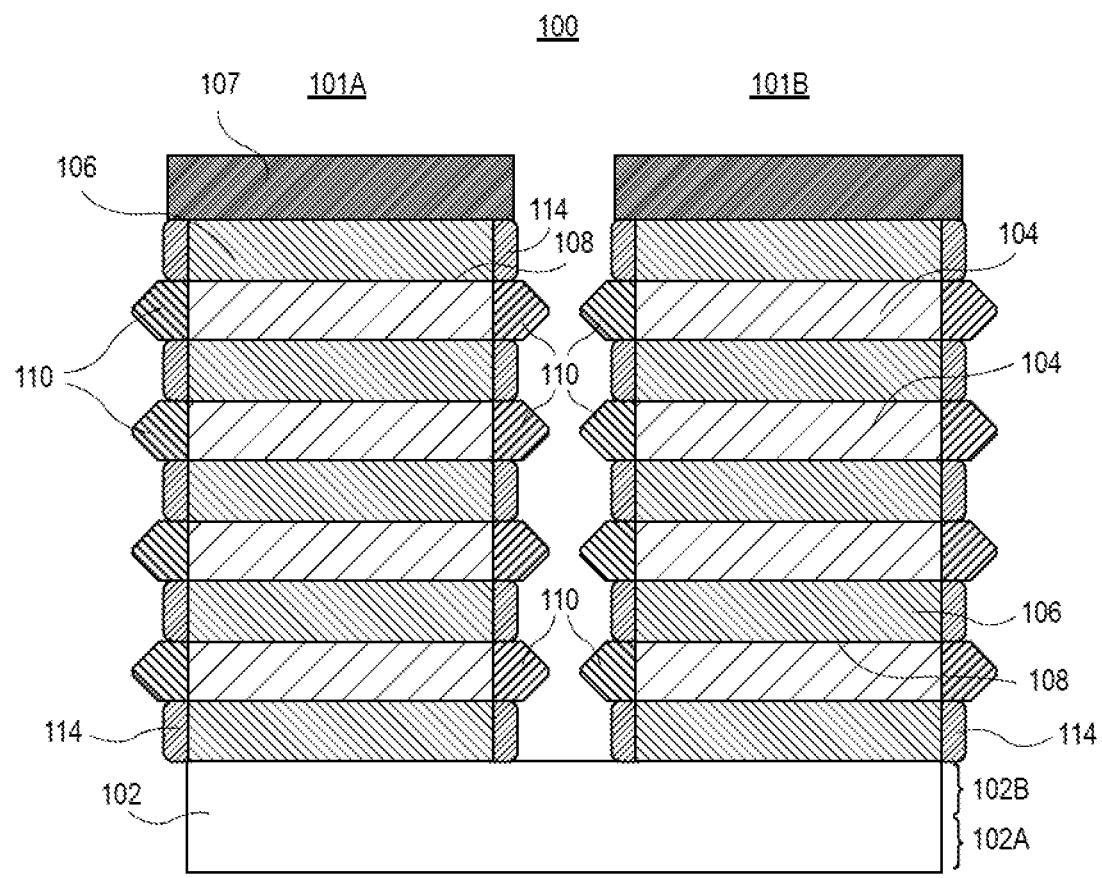
FIG. 1 illustrates a cross-sectional view representing a gate-all-around integrated circuit structure having source or drain structures with epitaxial nubs, in accordance with an embodiment of the present disclosure.

Gate-all-around integrated circuit structures having source or drain structures with epitaxial nubs, and methods of fabricating gate-all-around integrated circuit structures having source or drain structures with epitaxial nubs, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to gate-all-around transistors with epitaxial (EPI) source or drain nubs, and methods of fabricating gate-all-around transistors with epitaxial (EPI) source or drain nubs.

To provide context, for transistors, the contact resistance between a source or drain and a silicide material can be limited by the contact area. The contribution of contact resistance is also becoming an increasingly significant portion of the overall parasitic resistance of transistors. Additionally, spreading resistance within the source or drain may be impacted by the small contact area. The problem of decreasing contact area with scaling is a significant challenge that needs to be resolved.

To provide further context, current solutions for addressing contact resistance involve the determination of a low resistance source or drain material as well as excessively doping a top layer of the source or drain. The only known method to address spreading resistance is to seek a low resistance source or drain material. In such current solutions, there may be a fundamental limit to how low the resistance of a source/or drain material can be without changing the source drain material to a metal, which results in its own issues including introducing a Schottky barrier between the channel and the source or drain as well as potentially creating an easy leakage path between the gate and the source or drain contact. Additionally, excessive doping the top of the source or drain can result in the dopant diffusing into the bulk source or drain. The diffused dopant is likely to be inactive and will only degrade mobility and further increase spreading resistance.

In an embodiment, during the selective epitaxial deposition of the source or drain, typically, only a thin doped layer is deposited (for example, a thin SiGe:B layer) that will become the final source or drain. This is followed by an in-situ selective sacrificial layer (for example, i-SiGe) deposition to fill the rest of the source or drain opening. Then, when the source or drain is opened again to make contact, the intrinsic layer is selectively etched out, resulting in the doped source or drain being exposed, and the contact metal is deposited onto the doped source or drain.

Embodiments described herein may be implemented to increase the contact area between the metal contact and the source or drain while reducing the volume of the EPI source or drain. The change in source or drain shape may reduce contact resistance and reduce the impact of any resistance in the source or drain including spreading resistance. This may ultimately lead to an improvement in the external resistance, increased current at operating voltage, and improvement in a transistor's overall performance.

In an embodiment, epitaxial source or drain nubs are grown during a typical source or drain growth. However, in the present case, only a very thin doped source or drain is deposited. The rest of the typical source drain volume is filled with a second (sacrificial) material that can be etched out leaving the doped source or drain material behind. An example is to deposit a thin highly doped SiGe:B film where the Ge is nearly, e.g., 50% as the nub, and to fill the rest of the source or drain volume with nominally intrinsic SiGe with Ge near, e.g., 30%. It is to be appreciated that the sacrificial layer may be deposited in-situ to the active source or drain or may be deposited ex-situ on another tool, similar to other spacer layers. It is to be appreciated that, in some embodiments, that the sacrificial layer can essentially be any other spacer layer that can be selectively etched out at the end. Also, if another spacer layer is used, the active source drain composition can differ from 50% Ge. In an embodiment, the fabrication of a transistor then continues as normal until the source or drain is re-opened for contact formation. At this point in the processing, an additional etch is implemented to remove the sacrificial layer, e.g., removal of the i-SiGe, leaving behind the thin EPI source or drain layers (nubs). Then, typical contact layers (e.g., Ti, TiN, and contact metal) are deposited into the source drain volume, with most of the volume being filled with the contact metal. In a specific embodiment, the above process is performed on a fin structure where the source or drain nub appears as a small layer. In a specific embodiment, the above process is performed on nanowires or nanoribbons and the source or drain growth appears as nubs.

It is to be appreciated that embodiments described herein may be particularly useful in a nanowire/nanoribbon scheme where the EPI source or drain is grown only from small sidewalls of the nanowires/ribbons and is not anchored to the substrate. This approach may prevent the source or drain from being able to provide strain to the channel. Thus, the smaller volume of source or drain may not cause a reduction in strain but may provide a boost in the external resistance and overall performance of the device.

It is to be appreciated that the presence of EPI nubs may be obvious in cross-sectional analysis. In a gate cut, a thin epitaxial doped source or drain material may be observed next to the channel, with the contact metal filling in the rest of the EPI undercut (EUC) location. This is different from a typical finFET that has the EUC filled with epitaxial doped source or drain material. In a fin cut through the source or drain, a typical diamond shaped mushroomed EUC may not be observed, but rather the space is filled with contact metal.

It is to be appreciated that the concept of EPI nubs described herein can be used for both N-type and P-type source or drains as well as on CMOS devices. Embodiments may be implemented for use with a variety of channel materials including, but not limited to, strained or unstrained Si, strained or unstrained SiGe, Ge, Sn containing channels, and III-V channels. An EPI nubs process may be suitable for both gate first or gate last approaches. An EPI nubs approach can also be used on a variety of architectures including, but not limited to, finFETS, tunnel FETs (TFETs), nanowires, stacked nanowires, nanoribbons, stacked nanoribbons, stacked CMOS, and architectures where the backend contacts are made from the backside for the wafer though a via. In an embodiment, the sacrificial source or drain fill (second layer) can be deposited in-situ to the active source drain or deposited ex-situ to the active source or drain. In another embodiment, various substrate (or channel) orientations, e.g., 100 versus 110 starting wafers, may be used.

To provide further context, epitaxial source or drains for nanowire or nanoribbon structures nucleate from each wire nub and, if grown to fill an entire source or drain recess, may suffer from high resistance grain boundaries and voids. Standard source or drain processing involves a full-fill epitaxial approach. However, voids and grain boundaries may form where the growth fronts meet.

In accordance with an embodiment of the present disclosure, a nanowire or nanoribbon process flow is performed up until and including a source or drain (S/D) recess etch. At epitaxial source or drain processing, rather than performing a full fill, a partial deposition is performed such that regions adjacent to channel wires are selectively capped with a layer but source or drain regions on opposing sides of the source or drain recess do not fully merge. Remaining unfilled portions of the source or drain recesses may then be selectively filled with a sacrificial material until contact regions are opened again during conductive contact fabrication. In one embodiment, the sacrificial material is removed and replaced with an optional conductive contact resistance reducing layer and then a conductive fill (e.g., electrically metallic). As an example of a structure prior to contact formation, FIG. 1 illustrates a cross-sectional view representing a gate-all-around integrated circuit structure having source or drain structures with epitaxial nubs, in accordance with an embodiment of the present disclosure.

Referring to FIG. 1, an integrated circuit structure 100 includes structures 101A and 101B formed above a substrate 102. Substrate 102 may be or include a silicon sub-fin. In the case that substrate 102 includes or is a silicon fin, a sub-fin portion 102B may be above a lower substrate portion 102A. Each of structures 101A and 101B includes a vertical arrangement of horizontal nanowires 104 above substrate 102. Each of structures 101A and 101B includes a gate stack, the gate stack including a gate electrode 106 and a gate dielectric 108. Each gate stack is around the vertical arrangement of horizontal nanowires 104. A gate cap 107 may be included on each gate stack, as is depicted. At the stage depicted, the gate stack may be a dummy gate stack or a permanent gate stack. Gate spacers 114 may be adjacent portions of the gate stack. Epitaxial source or drain structures are at ends of the vertical arrangement of horizontal nanowires 104 of each of the structures 101A and 101B. Each epitaxial source or drain structure includes epitaxial nubs 110 aligned with the vertical arrangement of horizontal nanowires 104. In one embodiment, the epitaxial nubs 110 are vertically discrete portions, as is depicted.

In an embodiment, each of the epitaxial nubs 110 has a defined geometrical shape. For example, in one embodiment, each of the epitaxial nubs 110 has one or more facets. In another embodiment, each of the epitaxial nubs 110 has a non-defined or amorphous shape. For example, in one embodiment, each of the epitaxial nubs 110 has a globular shape.

Referring again to FIG. 1, in accordance with an embodiment of the present disclosure, the most proximate of the pairs of epitaxial source or drain structures of integrated circuit structures 100 includes structures 101A and 101B are laterally adjacent to but not merged with one another, as is depicted. Although, not depicted in FIG. 1 but explained in greater detail with respect to FIG. 2, a conductive contact structure is ultimately formed laterally between and in contact with the most proximate of the pairs of epitaxial source or drain structures of integrated circuit structures 100 includes structures 101A and 101B. In one such embodiment, the conductive contact structure surrounds the vertically discrete portions 110 of the first pair of epitaxial source or drain structures and surrounds the vertically discrete portions 110 of the second pair of epitaxial source or drain structures.

In an embodiment, the epitaxial nubs 110 are composed of a semiconductor material different than a semiconductor material of the nanowires 104. In one such embodiment, the epitaxial nubs 110 are composed of silicon germanium, and the nanowires 104 are composed of silicon. In an embodiment, the epitaxial source or drain structures (which include epitaxial nubs 110) are compressive-stressing structures. In another embodiment, the epitaxial source or drain structures (which include epitaxial nubs 110) are tensile-stressing source or drain structures. In an embodiment, the gate dielectric 108 includes a high-k gate dielectric layer, and the gate electrode 106 is a metal gate electrode.

In one aspect, a sacrificial contact structure is used in the fabrication of an integrated circuit structure. As an example, FIG. 2 illustrates cross-sectional views of various operations in a method of fabricating a gate-all-around integrated circuit structure having source or drain structures with epitaxial nubs, in accordance with an embodiment of the present disclosure.

Figure 2:
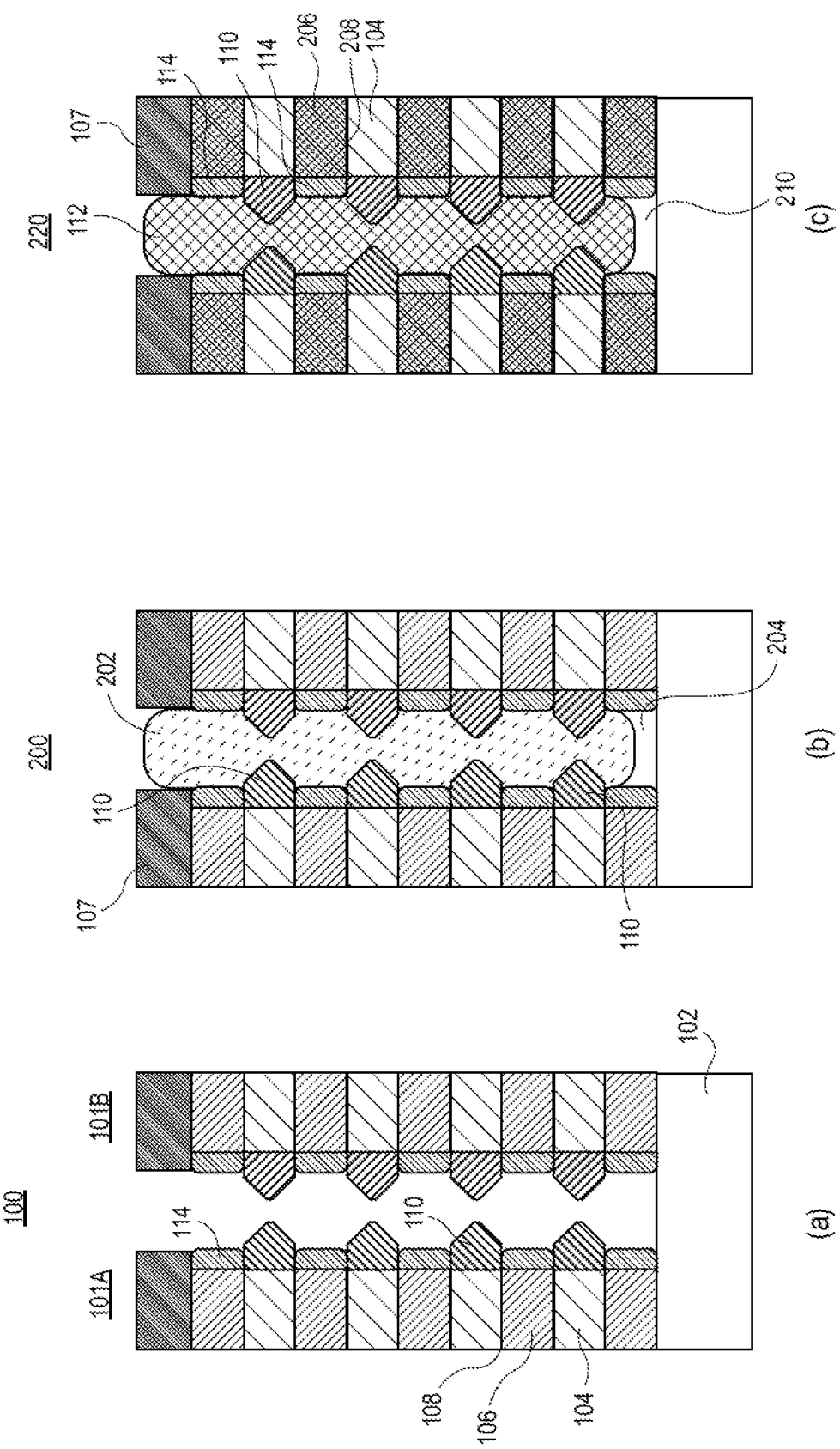
FIG. 2 illustrates cross-sectional views of various operations in a method of fabricating a gate-all-around integrated circuit structure having source or drain structures with epitaxial nubs, in accordance with an embodiment of the present disclosure.

Referring to part (a) of FIG. 2, a method of fabricating an integrated circuit structure includes forming a first vertical arrangement 101A of horizontal nanowires 104 and a second vertical arrangement 101B of horizontal nanowires 104. For example, a starting structure may be one such as structure 100 described in association with FIG. 1. In one embodiment, the gate electrode structures 106 and gate dielectric structures 108 are dummy gate electrode structures and dummy gate dielectric structures, respectively. Thus, a first dummy gate stack is over the first vertical arrangement 101A of horizontal nanowires 104, and a second dummy gate stack is over the second vertical arrangement 101B of horizontal nanowires 104.

In an embodiment, a first pair of epitaxial source or drain structures is at first and second ends of the first vertical arrangement 101A of horizontal nanowires 104 (right-hand side shown for 101A), where the first pair of epitaxial source or drain structures includes vertically discrete portions 110 aligned with the first vertical arrangement 101A of horizontal nanowires 104. A second pair of epitaxial source or drain structures is at first and second ends of the second vertical arrangement 101B of horizontal nanowires 104 (left-hand side shown for 101B), where the second pair of epitaxial source or drain structures includes vertically discrete portions 110 aligned with the second vertical arrangement 101B of horizontal nanowires 104. One of the first pair of epitaxial source or drain structures is laterally adjacent to but not merged with one of the second pair of epitaxial source or drain structures, e.g., the proximate epitaxial source or drain structures shown in part (a) of FIG. 2.

Referring to part (b) of FIG. 2, for structure 200, a dummy contact structure 202 is formed between and in contact with the one of the first pair of epitaxial source or drain structures and the one of the second pair of epitaxial source or drain structures. In one embodiment, a cavity 204 is included beneath dummy contact structure 202 where the material of dummy contact structure 202 is not or cannot be formed, as is depicted.

Referring to part (c) of FIG. 2, for structure 220, subsequent to forming dummy contact structure 202, the first and second dummy gate stacks 106/108 are replaced with first and second permanent gate stacks 206/208, respectively, in a replacement gate process. Subsequent to replacing the first and second dummy gate stacks 106/108 with the first and second permanent gate stacks 206/208, the dummy contact structure 202 is removed. A conductive contact structure 112 is formed laterally between and in contact with the one of the first pair of epitaxial source or drain structures and the one of the second pair of epitaxial source or drain structures. In an embodiment, as is depicted, the conductive contact structure 112 surrounds the vertically discrete portions 110 of the first pair of epitaxial source or drain structures and surrounds the vertically discrete portions 110 of the second pair of epitaxial source or drain structures. In one embodiment, a cavity 210 is included beneath conductive contact structure 112 where the material of conductive contact structure 112 is not or cannot be formed, as is depicted.

It is to be appreciated that the vertically discrete portions 110 are referred to as vertically discrete because vertically adjacent portions 110 of a same source or drain structure are not merged with one another (e.g., portions 110 of the right-hand source or drain structure of integrated circuit structure 101A are not merged with one another). The exemplary embodiments of FIGS. 1 and 2 include such vertically discrete portions or nubs 110. In another embodiment, however, epitaxial portions or nubs of source or drain structures described herein are vertically non-discrete portions in that vertically adjacent nubs of a same source or drain structure are merged with one another.

As an exemplary process scheme involving fabrication of vertically non-discrete portions, FIGS. 3A-3H illustrate cross-sectional views of various operations in a method of fabricating a gate-all-around integrated circuit structure having source or drain structures with epitaxial nubs, in accordance with an embodiment of the present disclosure.

Figures 3A, 3B:
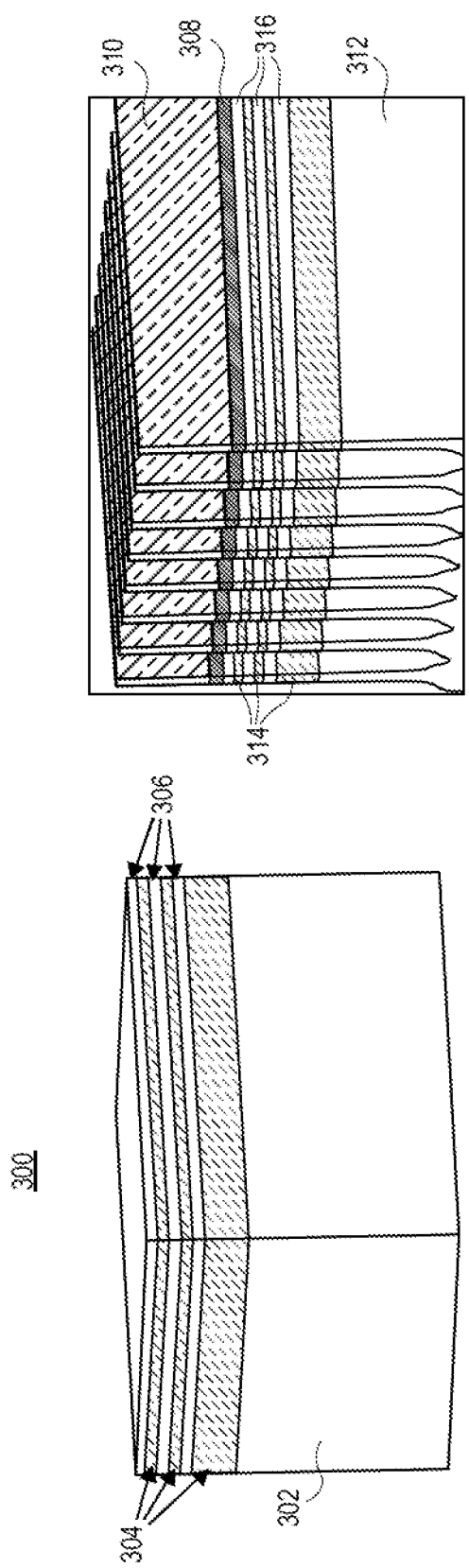
FIGS. 3A-3H illustrate cross-sectional views of various operations in a method of fabricating a gate-all-around integrated circuit structure having source or drain structures with epitaxial nubs, in accordance with an embodiment of the present disclosure.

Referring to FIG. 3A, a starting structure 300 includes alternating silicon germanium layers 304 and silicon layers 306 above a substrate 302, such as a silicon substrate.

Referring to FIG. 3B, a mask is formed over the structure of FIG. 3A. The mask may include a hardmask 310 over a protective layer 308 (where the protective layer 308 may ultimately be retained or removed). The mask is then patterned and, in turn, used to pattern the alternating silicon germanium layers 304 and silicon layers 306 and, possibly, a portion of substrate 302. The patterning forms alternating patterned silicon germanium layers 314 and patterned silicon layers 316 as a plurality of collective fins where, possibly, each fin is on a corresponding sub-fin portion 312.

Figure 3C:
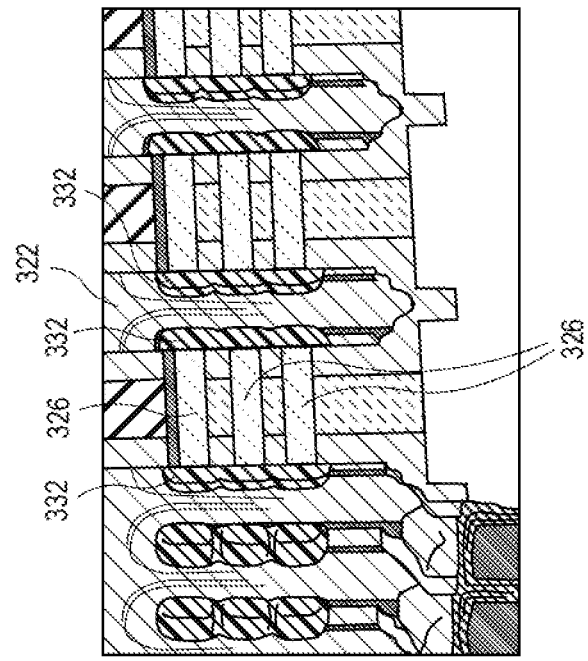

Referring to FIG. 3C, dummy gate structures 318 are formed over the structure of FIG. 3B. The plurality of collective fins is patterned using the dummy gate structures 318. At this stage, patterned silicon layers 316 are now twice patterned and may be referred to as silicon nanowires 326. Following the patterning using dummy gate structures 318, the patterned silicon germanium layers 314 are now twice patterned, and may be further recessed to form sacrificial intervening structures 324. Gate spacers 320 may then be formed adjacent to sidewalls of dummy gate structures 318 and in locations 328 where the patterned silicon germanium layers 314 are further recessed, as is depicted. A protection cap 330 may be formed (or retained from 308), and may be extended along fin sidewalls at this stage, as is depicted.

Thus, with reference to FIG. 3C, in an embodiment, a method of fabricating an integrated circuit structure includes forming a first vertical arrangement of horizontal nanowires 326 (left-hand side structure) and a second vertical arrangement of horizontal nanowires 326 (middle structure). A first dummy gate stack 318 (left-hand side structure) is formed over the first vertical arrangement of horizontal nanowires 326. A second dummy gate stack 318 (middle structure) is formed over the second vertical arrangement of horizontal nanowires 326. Cavities 322 are between dummy gate stacks and between adjacent vertical arrangements of horizontal nanowires 326.

Figure 3D:
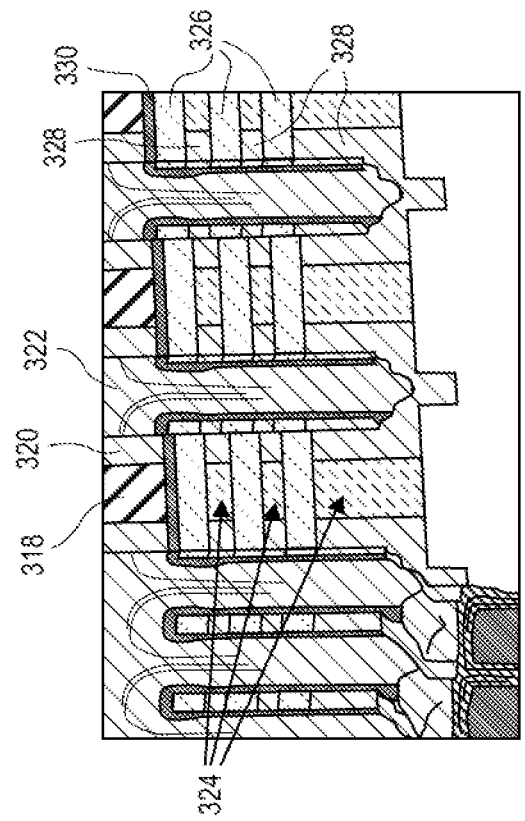

Referring to FIG. 3D, a first pair of epitaxial source or drain structures is formed at first and second ends of the first vertical arrangement of horizontal nanowires 326 (left-hand side structure), and a second pair of epitaxial source or drain structures is formed at first and second ends of the second vertical arrangement of horizontal nanowires 326 (middle structure). The first and second pairs of epitaxial source or drain structures include vertically non-discrete portions 332 aligned with the first and second vertical arrangements of horizontal nanowires 326, respectively. One of the first pair of epitaxial source or drain structures is laterally adjacent to but not merged with one of the second pair of epitaxial source or drain structures, as is depicted.

Figure 3F:
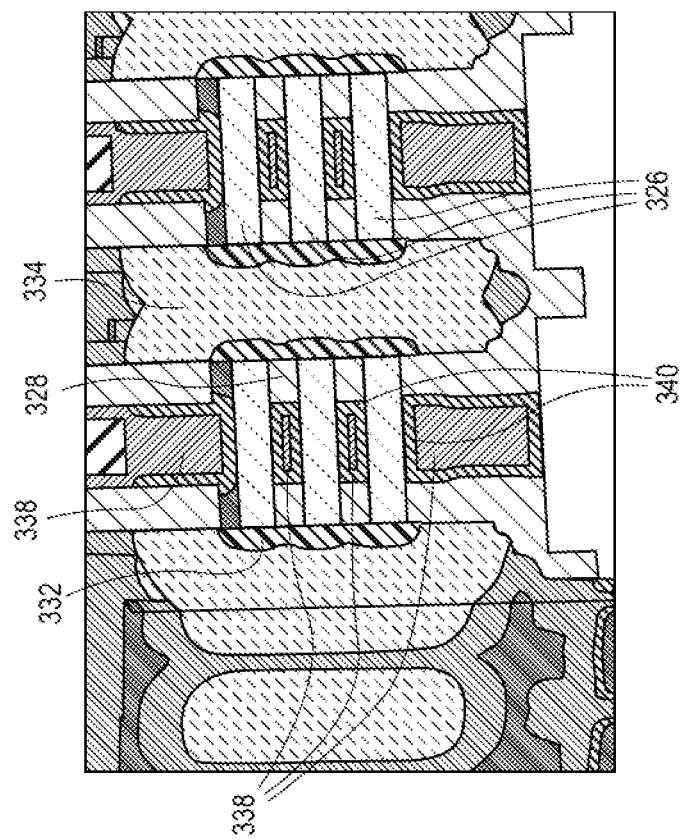
Figure 3E:
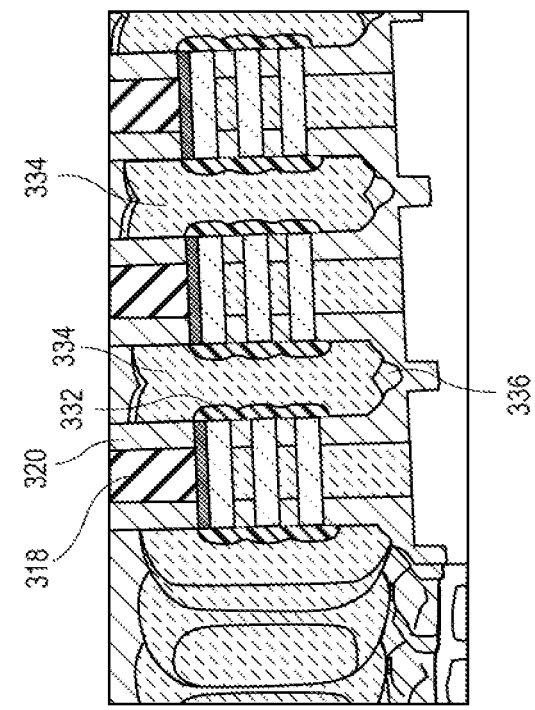

Referring to FIG. 3E, a dummy contact structure 334 is formed between and in contact with the laterally adjacent epitaxial source or drain structures of adjacent vertical stacks of nanowires. In one embodiment, a cavity 336 is included beneath dummy contact structure 334 where the material of dummy contact structure 334 is not or cannot be formed, as is depicted.

Referring to FIG. 3F, subsequent to forming the dummy contact structure 334, the dummy gate stacks 318 are replaced with permanent gate stacks. In one embodiment, the permanent gate stacks include a permanent gate electrode 338 and a permanent gate dielectric 340. In an embodiment, the sacrificial intervening structures 324 (e.g., sacrificial silicon germanium material) is also replaced with the permanent gate electrode 338 and the permanent gate dielectric 340, as is depicted.

Figure 3H:
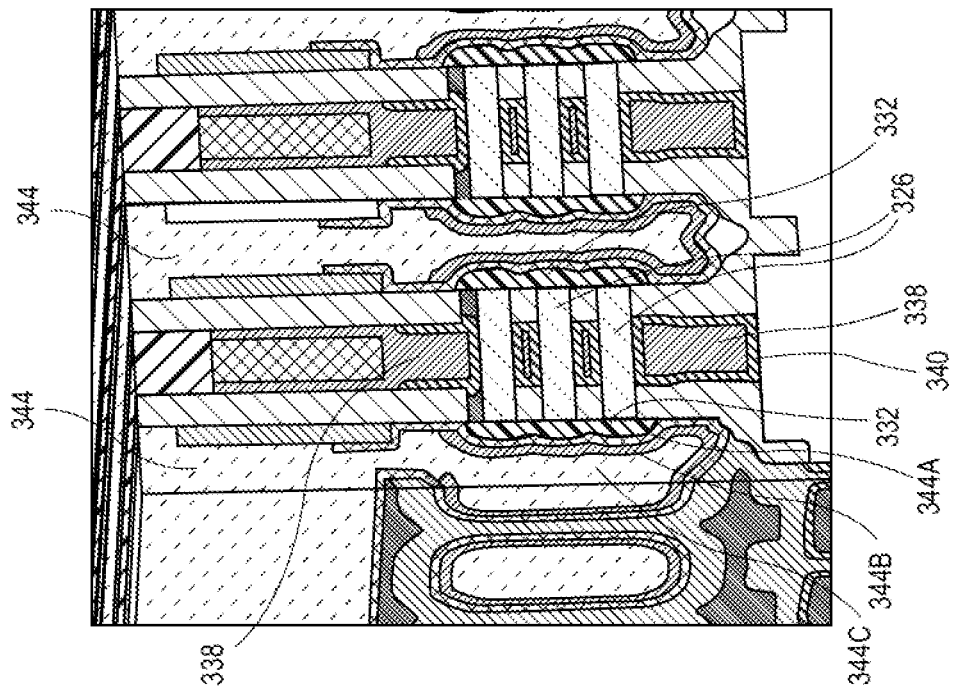
Figure 3G:
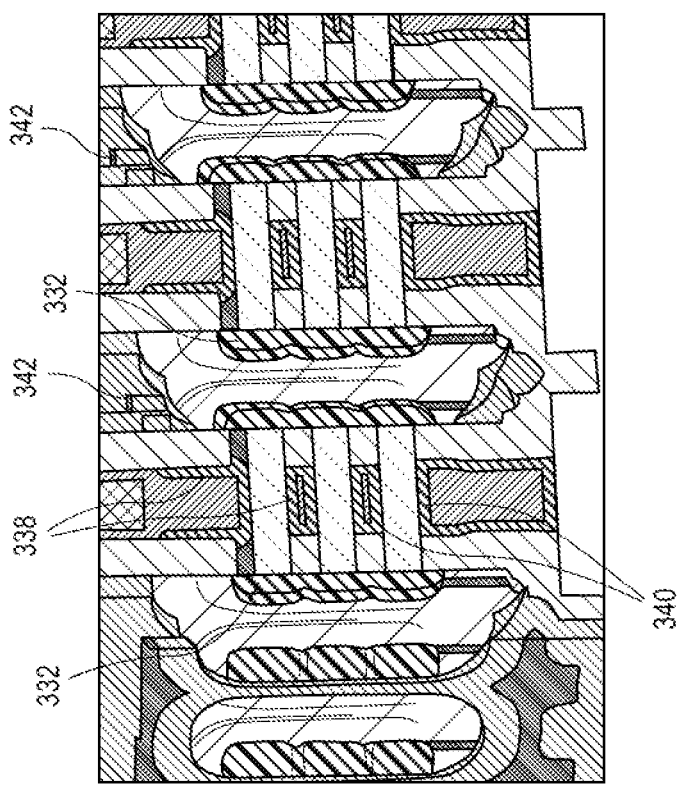

Referring to FIG. 3G, subsequent to replacing the dummy gate stacks 318 with the permanent gate stacks, the dummy contact structures 334 are removed. In one embodiment, removal of dummy contact structures 334 forms gaps 342.

Referring to FIG. 3H, conductive contact structures 344 are formed laterally between and in contact with adjacent ones of epitaxial source or drain structures. In a particular embodiment, each conductive contact structure 344 includes a first conductive layer 344A, a second conductive layer 344B, and a third conductive layer 344C. In one such embodiment, first conductive layer 344A is or includes a layer of titanium, second conductive layer 344B is or includes a layer of titanium nitride, and third conductive layer 344C is or includes a layer of tungsten.

Referring again to FIG. 3H, in an embodiment, the resulting epitaxial source or drain structures (which include epitaxial nubs 332) are compressive-stressing structures. In another embodiment, the epitaxial source or drain structures (which include epitaxial nubs 332) are tensile-stressing source or drain structures. In an embodiment, the permanent gate dielectric 340 includes a high-k gate dielectric layer, and the permanent gate electrode 338 includes a metal gate electrode. In an embodiment, a sub-fin structure is beneath each vertical arrangement of horizontal nanowires, as is depicted.

In another aspect, nanowire release processing may be performed through a replacement gate trench. Examples of such release processes are described below. Additionally, in yet another aspect, backend (BE) interconnect scaling can result in lower performance and higher manufacturing cost due to patterning complexity. Embodiments described herein may be implemented to enable front and backside interconnect integration for nanowire transistors. Embodiments described herein may provide an approach to achieve a relatively wider interconnect pitch. The result may be improved product performance and lower patterning costs. Embodiments may be implemented to enable robust functionality of scaled nanowire or nanoribbon transistors with low power and high performance.

One or more embodiments described herein are directed dual epitaxial (EPI) connections for nanowire or nanoribbon transistors using partial source or drain (SD) and asymmetric trench contact (TCN) depth. In an embodiment, an integrated circuit structure is fabricated by forming source-drain openings of nanowire/nanoribbon transistors which are partially filled with SD epitaxy. A remainder of the opening is filled with a conductive material. Deep trench formation on one of the source or drain side enables direct contact to a backside interconnect level.

In an exemplary process flow, FIGS. 4A-4J illustrates cross-sectional views of various operations in a method of fabricating a gate-all-around integrated circuit structure, in accordance with an embodiment of the present disclosure.

Figure 4B:
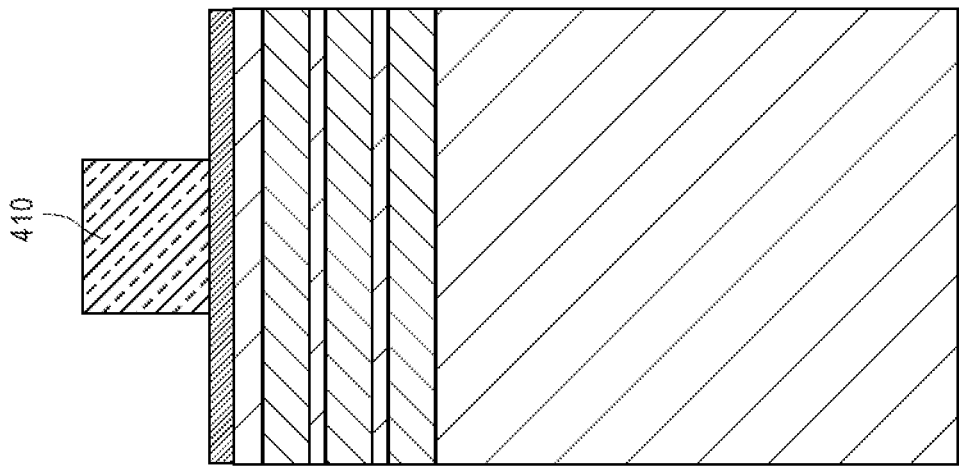
Figure 4A:
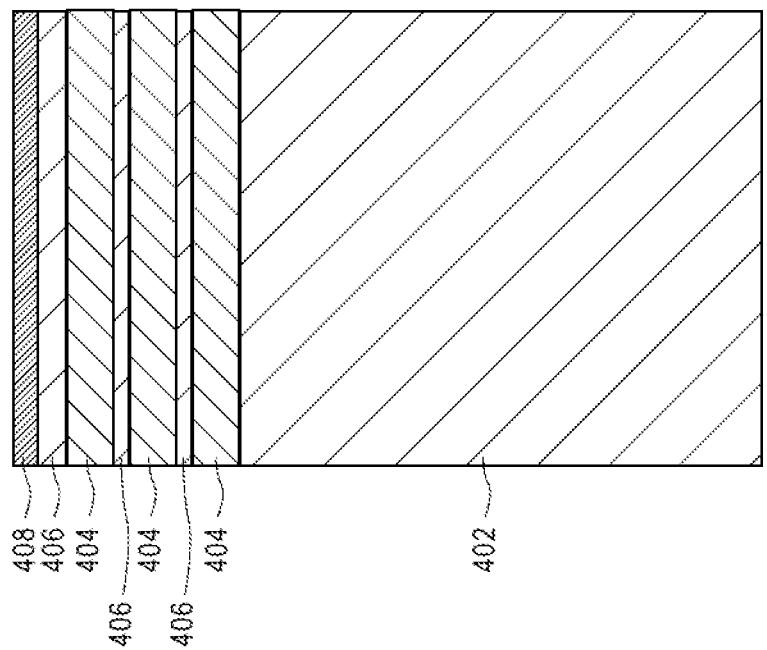

Referring to FIG. 4A, a method of fabricating an integrated circuit structure includes forming a starting stack which includes alternating silicon germanium layer 404 and silicon layers 406 above a fin 402, such as a silicon fin. The silicon layers 406 may be referred to as a vertical arrangement of silicon nanowires. A protective cap 408 may be formed above the alternating silicon germanium layer 404 and silicon layers 406, as is depicted.

Referring to FIG. 4B, a gate stack 410 is formed over the vertical arrangement of horizontal nanowires 406. Portions of the vertical arrangement of horizontal nanowires 406 are then released by removing portions of the silicon germanium layer 404 to provide recessed silicon germanium layers 404' and cavities 412, as is depicted in FIG. 4C.

It is to be appreciated that the structure of FIG. 4C may be fabricated to completion without first performing the deep etch and asymmetric contact processing described below. In either case (e.g., with or without asymmetric contact processing), in an embodiment, a fabrication process involves use of a process scheme that provides a gate-all-around integrated circuit structure having epitaxial nubs, which may be vertically discrete or vertically non-discrete source or drain structures, examples of which are described above in association with FIGS. 1, 2 and 3A-3H.

Figure 4D:
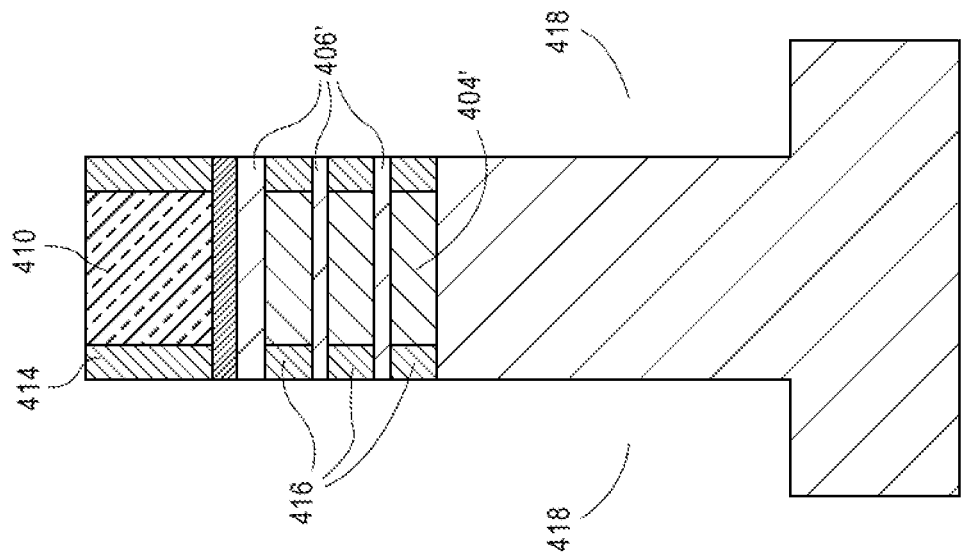
Figure 4C:
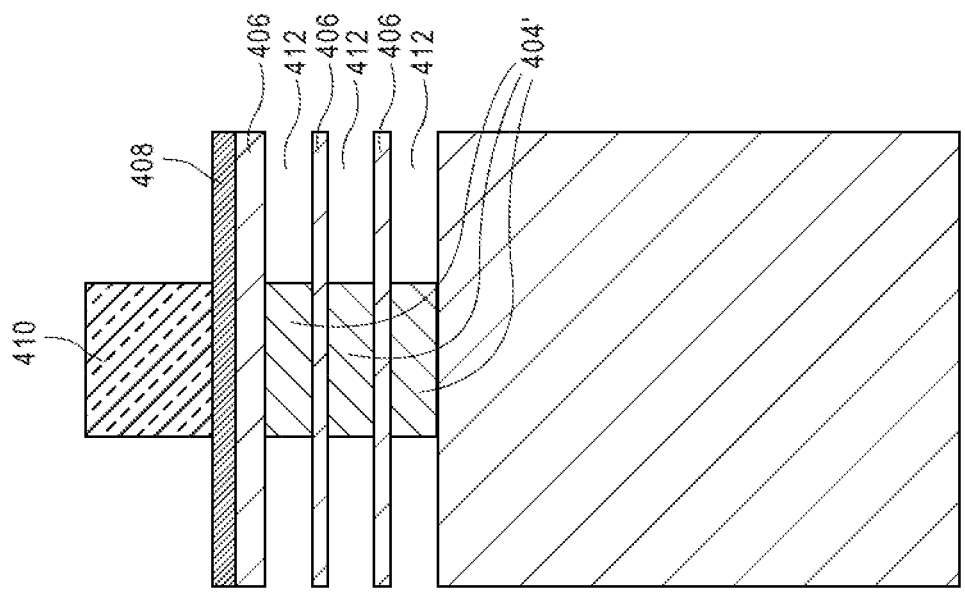

Referring to FIG. 4D, upper gate spacers 414 are formed at sidewalls of the gate structure 410. Cavity spacers 416 are formed in the cavities 412 beneath the upper gate spacers 414. A deep trench contact etch is then optionally performed to form trenches 418 and to formed recessed nanowires 406'. A sacrificial material 420 is then formed in the trenches 418, as is depicted in FIG. 4E (and commensurate with the embodiment depicted in FIG. 2). In other process schemes, an isolated trench bottom or silicon trench bottom may be used.

Referring to FIG. 4F, a first epitaxial source or drain structure (e.g., left-hand features 422) is formed at a first end of the vertical arrangement of horizontal nanowires 406'. A second epitaxial source or drain structure (e.g., right-hand features 422) is formed at a second end of the vertical arrangement of horizontal nanowires 406'. In an embodiment, as depicted, the epitaxial source or drain structures 422 are vertically discrete source or drain structures, examples of which are described above in association with FIGS. 1 and 2. In a more general embodiment, epitaxial source or drain structures 422 have epitaxial nubs, which may be vertically discrete or vertically non-discrete source or drain structures, examples of which are described above in association with FIGS. 1, 2 and 3A-3H.

Figure 4H:
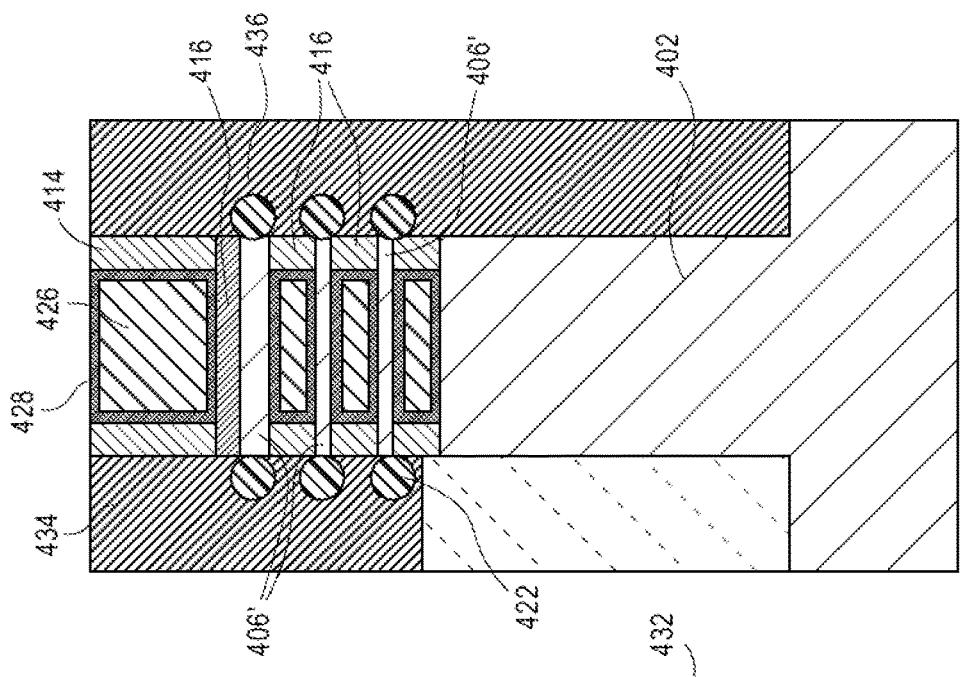
Figure 4I:
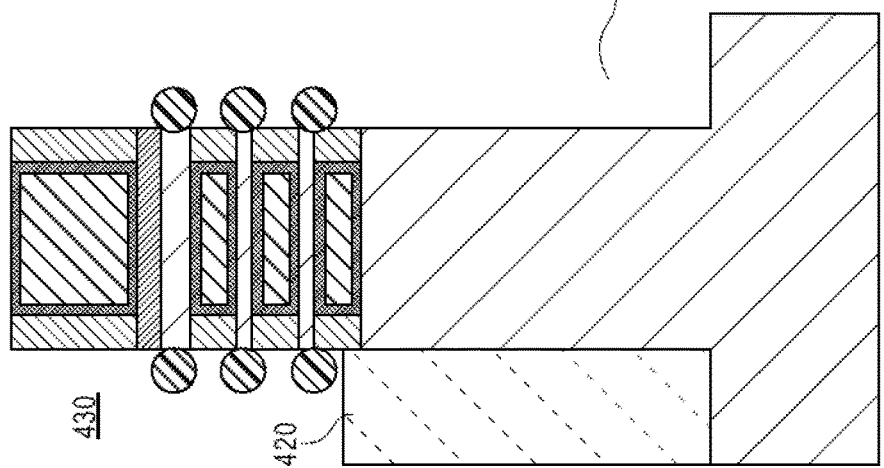

An inter-layer dielectric (ILD) material 424 is then formed at the sides of the gate electrode 410 and adjacent the source or drain structures 422, as is depicted in FIG. 4G. Referring to FIG. 4H, a replacement gate process is used to form a permanent gate dielectric 428 and a permanent gate electrode 426. The ILD material 424 is then removed, as is depicted in FIG. 4I. The sacrificial material 420 is then removed from one of the source drain locations (e.g., right-hand side) to form trench 432, but is not removed from the other of the source drain locations to form trench 430.

Figure 4J:
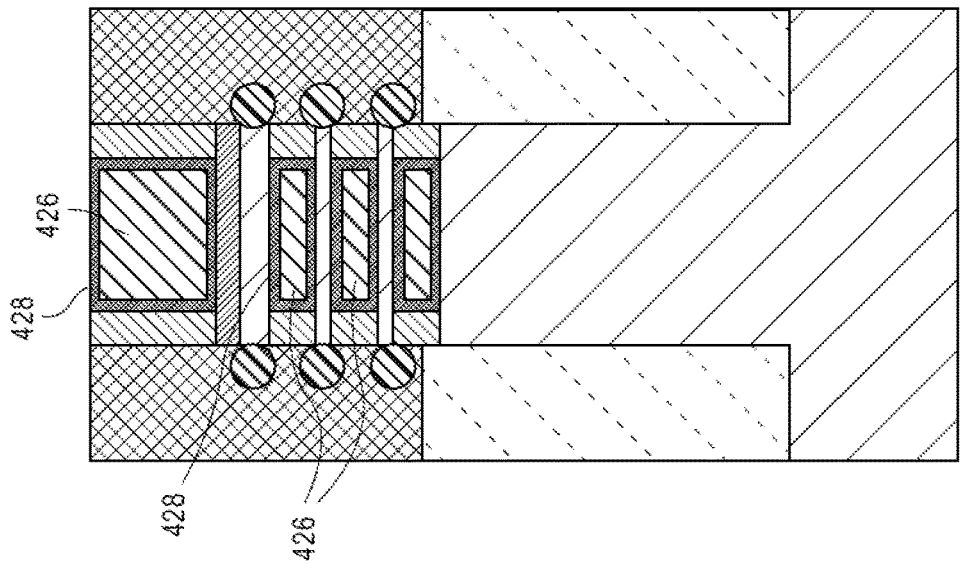

Referring to FIG. 4J, a first conductive contact structure 434 is formed coupled to the first epitaxial source or drain structure (e.g., left-hand features 422). A second conductive contact structure 436 is formed coupled to the second epitaxial source or drain structure (e.g., right-hand features 422). The second conductive contact structure 436 is formed deeper along the fin 402 than the first conductive contact structure 434. In an embodiment, although not depicted in FIG. 4J, the method further includes forming an exposed surface of the second conductive contact structure 436 at a bottom of the fin 402. Conductive contacts may include a contact resistance reducing layer and a primary contact electrode layer, where examples can include Ti, Ni, Co for the former and W, Ru, Co for the latter.

In an embodiment, the second conductive contact structure 436 is deeper along the fin 402 than the first conductive contact structure 434, as is depicted. In one such embodiment, the first conductive contact structure 434 is not along the fin 402, as is depicted. In another such embodiment, not depicted, the first conductive contact structure 434 is partially along the fin 402.

In an embodiment, the second conductive contact structure 434 is along an entirety of the fin 402. In an embodiment, although not depicted, in the case that the bottom of the fin 402 is exposed by a backside substrate removal process, the second conductive contact structure 434 has an exposed surface at a bottom of the fin 402.

In another aspect, in order to enable access to both conductive contact structures of a pair of asymmetric source and drain contact structures, integrated circuit structures described herein may be fabricated using a back-side reveal of front-side structures fabrication approach. In some exemplary embodiments, reveal of the back-side of a transistor or other device structure entails wafer-level back-side processing. In contrast to a conventional TSV-type technology, a reveal of the back-side of a transistor as described herein may be performed at the density of the device cells, and even within sub-regions of a device. Furthermore, such a reveal of the back-side of a transistor may be performed to remove substantially all of a donor substrate upon which a device layer was disposed during front-side device processing. As such, a microns-deep TSV becomes unnecessary with the thickness of semiconductor in the device cells following a reveal of the back-side of a transistor potentially being only tens or hundreds of nanometers.

Reveal techniques described herein may enable a paradigm shift from "bottom-up" device fabrication to "center-out" fabrication, where the "center" is any layer that is employed in front-side fabrication, revealed from the back-side, and again employed in back-side fabrication. Processing of both a front-side and revealed back-side of a device structure may address many of the challenges associated with fabricating 3D ICs when primarily relying on front-side processing.

A reveal of the back-side of a transistor approach may be employed for example to remove at least a portion of a carrier layer and intervening layer of a donor-host substrate assembly. The process flow begins with an input of a donor-host substrate assembly. A thickness of a carrier layer in the donor-host substrate is polished (e.g., CMP) and/or etched with a wet or dry (e.g., plasma) etch process. Any grind, polish, and/or wet/dry etch process known to be suitable for the composition of the carrier layer may be employed. For example, where the carrier layer is a group IV semiconductor (e.g., silicon) a CMP slurry known to be suitable for thinning the semiconductor may be employed. Likewise, any wet etchant or plasma etch process known to be suitable for thinning the group IV semiconductor may also be employed.

In some embodiments, the above is preceded by cleaving the carrier layer along a fracture plane substantially parallel to the intervening layer. The cleaving or fracture process may be utilized to remove a substantial portion of the carrier layer as a bulk mass, reducing the polish or etch time needed to remove the carrier layer. For example, where a carrier layer is 400-900 μm in thickness, 100-700 μm may be cleaved off by practicing any blanket implant known to promote a wafer-level fracture. In some exemplary embodiments, a light element (e.g., H, He, or Li) is implanted to a uniform target depth within the carrier layer where the fracture plane is desired. Following such a cleaving process, the thickness of the carrier layer remaining in the donor-host substrate assembly may then be polished or etched to complete removal. Alternatively, where the carrier layer is not fractured, the grind, polish and/or etch operation may be employed to remove a greater thickness of the carrier layer.

Next, exposure of an intervening layer is detected. Detection is used to identify a point when the back-side surface of the donor substrate has advanced to nearly the device layer. Any endpoint detection technique known to be suitable for detecting a transition between the materials employed for the carrier layer and the intervening layer may be practiced. In some embodiments, one or more endpoint criteria are based on detecting a change in optical absorbance or emission of the back-side surface of the donor substrate during the polishing or etching performed. In some other embodiments, the endpoint criteria are associated with a change in optical absorbance or emission of byproducts during the polishing or etching of the donor substrate back-side surface. For example, absorbance or emission wavelengths associated with the carrier layer etch byproducts may change as a function of the different compositions of the carrier layer and intervening layer. In other embodiments, the endpoint criteria are associated with a change in mass of species in byproducts of polishing or etching the back-side surface of the donor substrate. For example, the byproducts of processing may be sampled through a quadrupole mass analyzer and a change in the species mass may be correlated to the different compositions of the carrier layer and intervening layer. In another exemplary embodiment, the endpoint criteria is associated with a change in friction between a back-side surface of the donor substrate and a polishing surface in contact with the back-side surface of the donor substrate.

Detection of the intervening layer may be enhanced where the removal process is selective to the carrier layer relative to the intervening layer as non-uniformity in the carrier removal process may be mitigated by an etch rate delta between the carrier layer and intervening layer. Detection may even be skipped if the grind, polish and/or etch operation removes the intervening layer at a rate sufficiently below the rate at which the carrier layer is removed. If an endpoint criteria is not employed, a grind, polish and/or etch operation of a predetermined fixed duration may stop on the intervening layer material if the thickness of the intervening layer is sufficient for the selectivity of the etch. In some examples, the carrier etch rate: intervening layer etch rate is 3:1-10:1, or more.

Upon exposing the intervening layer, at least a portion of the intervening layer may be removed. For example, one or more component layers of the intervening layer may be removed. A thickness of the intervening layer may be removed uniformly by a polish, for example. Alternatively, a thickness of the intervening layer may be removed with a masked or blanket etch process. The process may employ the same polish or etch process as that employed to thin the carrier, or may be a distinct process with distinct process parameters. For example, where the intervening layer provides an etch stop for the carrier removal process, the latter operation may employ a different polish or etch process that favors removal of the intervening layer over removal of the device layer. Where less than a few hundred nanometers of intervening layer thickness is to be removed, the removal process may be relatively slow, optimized for across-wafer uniformity, and more precisely controlled than that employed for removal of the carrier layer. A CHIP process employed may, for example employ a slurry that offers very high selectively (e.g., 100:1-300:1, or more) between semiconductor (e.g., silicon) and dielectric material (e.g., SiO) surrounding the device layer and embedded within the intervening layer, for example, as electrical isolation between adjacent device regions.

For embodiments where the device layer is revealed through complete removal of the intervening layer, back-side processing may commence on an exposed back-side of the device layer or specific device regions there in. In some embodiments, the back-side device layer processing includes a further polish or wet/dry etch through a thickness of the device layer disposed between the intervening layer and a device region previously fabricated in the device layer, such as a source or drain region.

In some embodiments where the carrier layer, intervening layer, or device layer back-side is recessed with a wet and/or plasma etch, such an etch may be a patterned etch or a materially selective etch that imparts significant non-planarity or topography into the device layer back-side surface. As described further below, the patterning may be within a device cell (i.e., "intra-cell" patterning) or may be across device cells (i.e., "inter-cell" patterning). In some patterned etch embodiments, at least a partial thickness of the intervening layer is employed as a hard mask for back-side device layer patterning. Hence, a masked etch process may preface a correspondingly masked device layer etch.

The above described processing scheme may result in a donor-host substrate assembly that includes IC devices that have a back-side of an intervening layer, a back-side of the device layer, and/or back-side of one or more semiconductor regions within the device layer, and/or front-side metallization revealed. Additional back-side processing of any of these revealed regions may then be performed during downstream processing.

It is to be appreciated that the structures resulting from the above exemplary processing schemes may be used in a same or similar form for subsequent processing operations to complete device fabrication, such as PMOS and/or NMOS device fabrication. As an example of a completed device, FIG. 5 illustrates a cross-sectional view of a non-planar integrated circuit structure as taken along a gate line, in accordance with an embodiment of the present disclosure.

Figure 5:
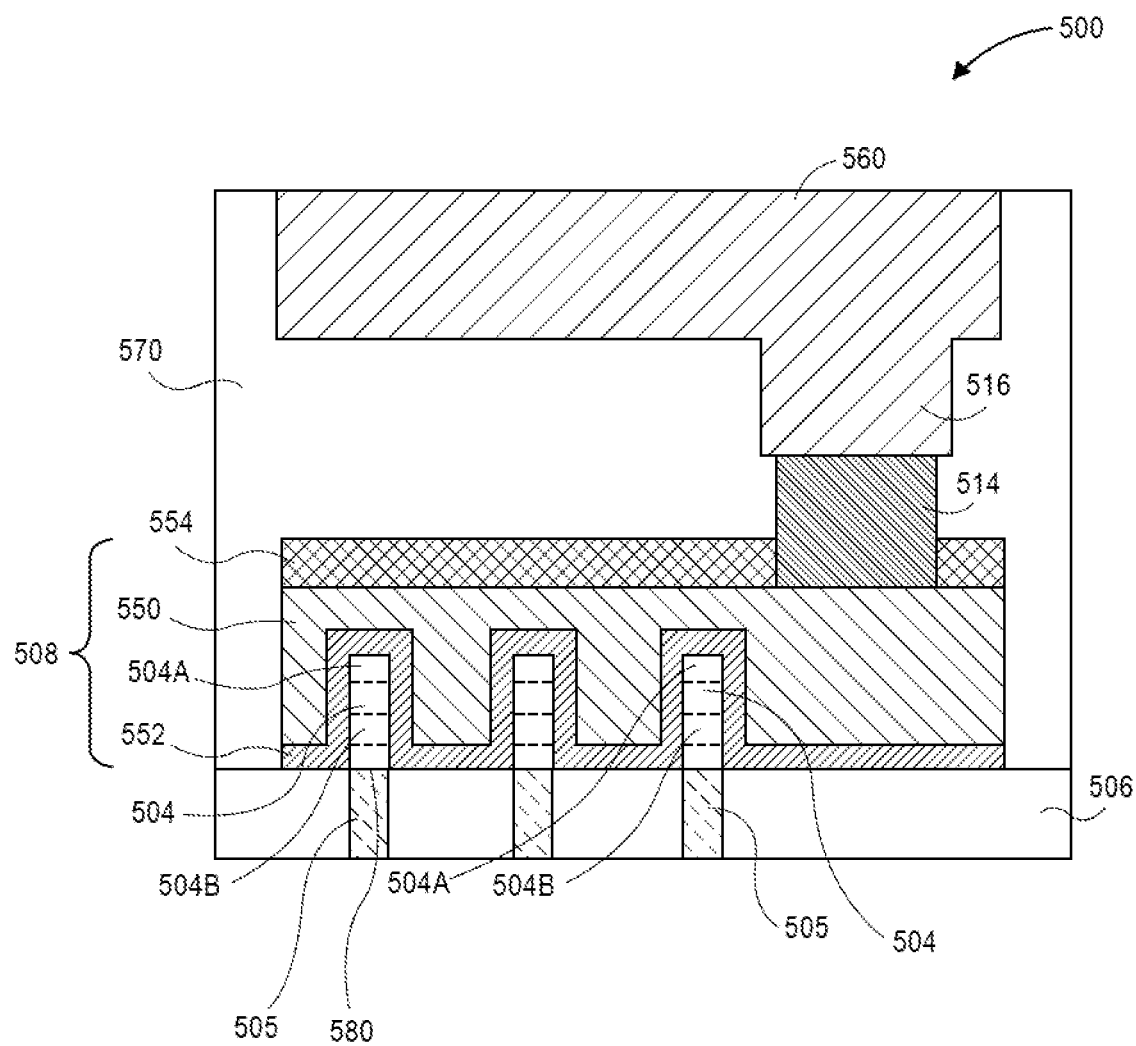
FIG. 5 illustrates a cross-sectional view of a non-planar integrated circuit structure as taken along a gate line, in accordance with an embodiment of the present disclosure.

Referring to FIG. 5, a semiconductor structure or device 500 includes a non-planar active region (e.g., a fin structure including protruding fin portion 504 and sub-fin region 505) within a trench isolation region 506. In an embodiment, instead of a solid fin, the non-planar active region is separated into nanowires (such as nanowires 504A and 504B) above sub-fin region 505, as is represented by the dashed lines. In either case, for ease of description for non-planar integrated circuit structure 500, a non-planar active region 504 is referenced below as a protruding fin portion. In an embodiment, a fabrication process involves use of a process scheme that provides a gate-all-around integrated circuit structure having epitaxial nubs, which may be vertically discrete or vertically non-discrete source or drain structures, examples of which are described above in association with FIGS. 1, 2 and 3A-3H.

A gate line 508 is disposed over the protruding portions 504 of the non-planar active region (including, if applicable, surrounding nanowires 504A and 504B), as well as over a portion of the trench isolation region 506. As shown, gate line 508 includes a gate electrode 550 and a gate dielectric layer 552. In one embodiment, gate line 508 may also include a dielectric cap layer 554. A gate contact 514, and overlying gate contact via 516 are also seen from this perspective, along with an overlying metal interconnect 560, all of which are disposed in inter-layer dielectric stacks or layers 570. Also seen from the perspective of FIG. 5, the gate contact 514 is, in one embodiment, disposed over trench isolation region 506, but not over the non-planar active regions.

In an embodiment, the semiconductor structure or device 500 is a non-planar device such as, but not limited to, a fin-FET device, a tri-gate device, a nanoribbon device, or a nanowire device. In such an embodiment, a corresponding semiconducting channel region is composed of or is formed in a three-dimensional body. In one such embodiment, the gate electrode stacks of gate lines 508 surround at least a top surface and a pair of sidewalls of the three-dimensional body.

As is also depicted in FIG. 5, in an embodiment, an interface 580 exists between a protruding fin portion 504 and sub-fin region 505. The interface 580 can be a transition region between a doped sub-fin region 505 and a lightly or undoped upper fin portion 504. In one such embodiment, each fin is approximately 10 nanometers wide or less, and sub-fin dopants are optionally supplied from an adjacent solid state doping layer at the sub-fin location. In a particular such embodiment, each fin is less than 10 nanometers wide.

Although not depicted in FIG. 5, it is to be appreciated that source or drain regions of or adjacent to the protruding fin portions 504 are on either side of the gate line 508, i.e., into and out of the page. In one embodiment, the source or drain regions are doped portions of original material of the protruding fin portions 504. In another embodiment, the material of the protruding fin portions 504 is removed and replaced with another semiconductor material, e.g., by epitaxial deposition to form epitaxial nubs, which may be vertically discrete or vertically non-discrete source or drain structures, examples of which are described above in association with FIGS. 1, 2 and 3A-3H. In either of the above two scenarios (doped original material, or epitaxial nubs), the source or drain regions may extend below the height of dielectric layer of trench isolation region 506, i.e., into the sub-fin region 505. In accordance with an embodiment of the present disclosure, the more heavily doped sub-fin regions, i.e., the doped portions of the fins below interface 580, inhibits source to drain leakage through this portion of the bulk semiconductor fins. In an embodiment, the source and drain regions have associated asymmetric source and drain contact structures, as described above in association with FIG. 4J.

With reference again to FIG. 5, in an embodiment, fins 504/505 (and, possibly nanowires 504A and 504B) are composed of a crystalline silicon, silicon/germanium or germanium layer doped with a charge carrier, such as but not limited to phosphorus, arsenic, boron or a combination thereof. In one embodiment, the concentration of silicon atoms is greater than 97%. In another embodiment, fins 504/505 are composed of a group III-V material, such as, but not limited to, gallium nitride, gallium phosphide, gallium arsenide, indium phosphide, indium antimonide, indium gallium arsenide, aluminum gallium arsenide, indium gallium phosphide, or a combination thereof. In another embodiment, the active wire is a SiGe alloy with Ge composition between 30 and 85%. Trench isolation region 506 may be composed of a dielectric material such as, but not limited to, silicon dioxide, silicon oxy-nitride, silicon nitride, or carbon-doped silicon nitride.

Gate line 508 may be composed of a gate electrode stack which includes a gate dielectric layer 552 and a gate electrode layer 550. In an embodiment, the gate electrode of the gate electrode stack is composed of a metal gate and the gate dielectric layer is composed of a high-k material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate fin 504. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 514 and overlying gate contact via 516 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In an embodiment (although not shown), a contact pattern which is essentially perfectly aligned to an existing gate pattern 508 is formed while eliminating the use of a lithographic step with exceedingly tight registration budget. In an embodiment, the contact pattern is a vertically asymmetric contact pattern, such as described in association with FIG. 4J. In other embodiments, all contacts are front-side connected and are not asymmetric. In one such embodiment, the self-aligned approach enables the use of intrinsically highly selective wet etching (e.g., versus conventionally implemented dry or plasma etching) to generate contact openings.

In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

In an embodiment, providing structure 500 involves fabrication of the gate stack structure 508 by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

Referring again to FIG. 5, the arrangement of semiconductor structure or device 500 places the gate contact over isolation regions. Such an arrangement may be viewed as inefficient use of layout space. In another embodiment, however, a semiconductor device has contact structures that contact portions of a gate electrode formed over an active region, e.g., over a fin 505, and in a same layer as a trench contact via.

It is to be appreciated that not all aspects of the processes described above need be practiced to fall within the spirit and scope of embodiments of the present disclosure. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a tri-gate device, an independently accessed double gate device, or a FIN-FET. One or more embodiments may be particularly useful for fabricating semiconductor devices at a sub-10 nanometer (10 nm) technology node.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers maybe formed by CVD, PVD, or by other deposition methods.

In an embodiment, as is also used throughout the present description, lithographic operations are performed using 193 nm immersion lithography (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In another aspect, one or more embodiments are directed to neighboring semiconductor structures or devices separated by self-aligned gate endcap (SAGE) structures. Particular embodiments may be directed to integration of multiple width (multi-Wsi) nanowires and nanoribbons in a SAGE architecture and separated by a SAGE wall. In an embodiment, nanowires/nanoribbons are integrated with multiple Wsi in a SAGE architecture portion of a front-end process flow. Such a process flow may involve integration of nanowires and nanoribbons of different Wsi to provide robust functionality of next generation transistors with low power and high performance. Associated epitaxial source or drain regions may be embedded (e.g., portions of nanowires removed and then source or drain (S/D) growth is performed), and may be or include epitaxial nubs, which may be vertically discrete or vertically non-discrete source or drain structures, examples of which are described above in association with FIGS. 1, 2 and 3A-3H.

To provide further context, advantages of a self-aligned gate endcap (SAGE) architecture may include the enabling of higher layout density and, in particular, scaling of diffusion to diffusion spacing. To provide illustrative comparison, FIG. 6 illustrates cross-sectional views taken through nanowires and fins for a non-endcap architecture (left-hand side) versus a self-aligned gate endcap (SAGE) architecture (right-hand side), in accordance with an embodiment of the present disclosure.

Figure 6:
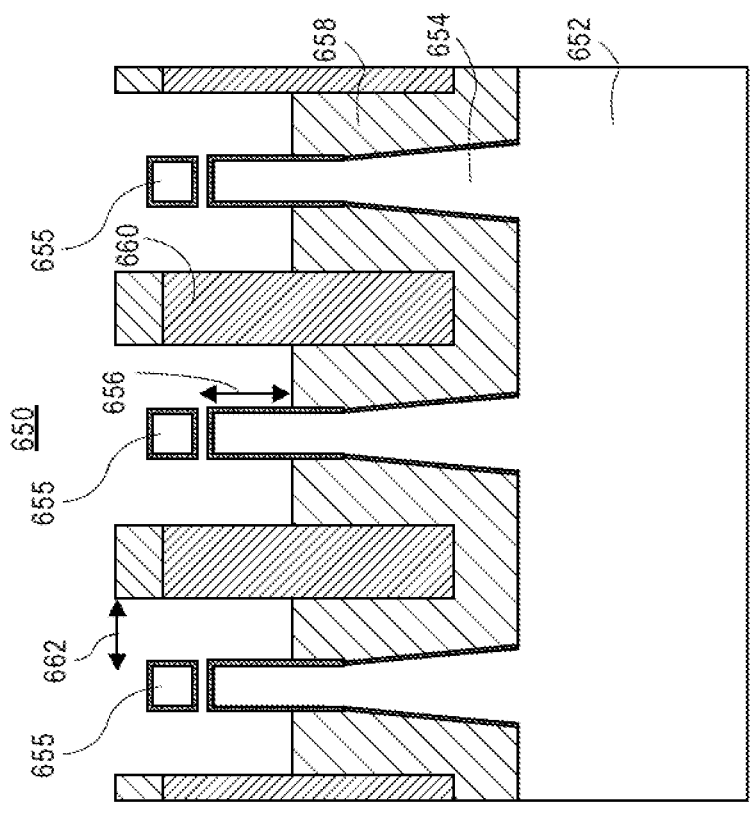
FIG. 6 illustrates cross-sectional views taken through nanowires and fins for a non-endcap architecture (left-hand side (a)) versus a self-aligned gate endcap (SAGE) architecture (right-hand side (b)), in accordance with an embodiment of the present disclosure.
Figure 6:
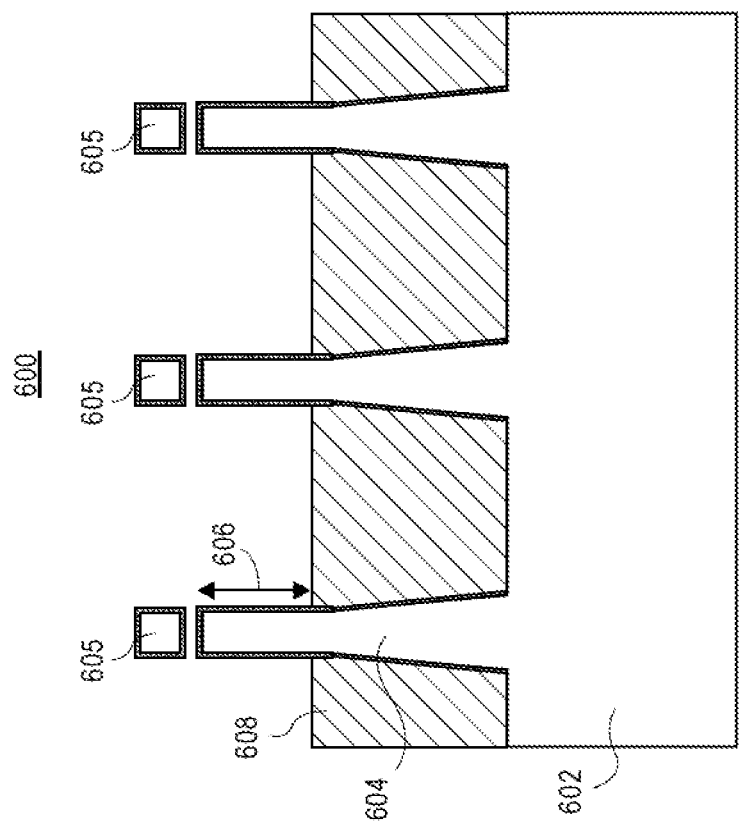

Referring to the left-hand side (a) of FIG. 6, an integrated circuit structure 600 includes a substrate 602 having fins 604 protruding therefrom by an amount 606 above an isolation structure 608 laterally surrounding lower portions of the fins 604. Corresponding nanowires 605 are over the fins 604. A gate structure may be formed over the integrated circuit structure 600 to fabricate a device. However, breaks in such a gate structure may be accommodated for by increasing the spacing between fin 604/nanowire 605 pairs.

By contrast, referring to the right-hand side (b) of FIG. 6, an integrated circuit structure 650 includes a substrate 652 having fins 654 protruding therefrom by an amount 656 above an isolation structure 658 laterally surrounding lower portions of the fins 654. Corresponding nanowires 655 are over the fins 654. Isolating SAGE walls 660 (which may include a hardmask thereon, as depicted) are included within the isolation structure 652 and between adjacent fin 654/nanowire 655 pairs. The distance between an isolating SAGE wall 660 and a nearest fin 654/nanowire 655 pair defines the gate endcap spacing 662. A gate structure may be formed over the integrated circuit structure 600, between insolating SAGE walls to fabricate a device. Breaks in such a gate structure are imposed by the isolating SAGE walls. Since the isolating SAGE walls 660 are self-aligned, restrictions from conventional approaches can be minimized to enable more aggressive diffusion to diffusion spacing. Furthermore, since gate structures include breaks at all locations, individual gate structure portions may be layer connected by local interconnects formed over the isolating SAGE walls 660. In an embodiment, as depicted, the SAGE walls 660 each include a lower dielectric portion and a dielectric cap on the lower dielectric portion.

In accordance with an embodiment of the present disclosure, a fabrication process for structures associated with FIG. 6 involves use of a process scheme that provides a gate-all-around integrated circuit structure having epitaxial nubs, which may be vertically discrete or vertically non-discrete source or drain structures, examples of which are described above in association with FIGS. 1, 2 and 3A-3H.

A self-aligned gate endcap (SAGE) processing scheme involves the formation of gate/trench contact endcaps self-aligned to fins without requiring an extra length to account for mask mis-registration. Thus, embodiments may be implemented to enable shrinking of transistor layout area. Embodiments described herein may involve the fabrication of gate endcap isolation structures, which may also be referred to as gate walls, isolation gate walls or self-aligned gate endcap (SAGE) walls.

Figure 7:
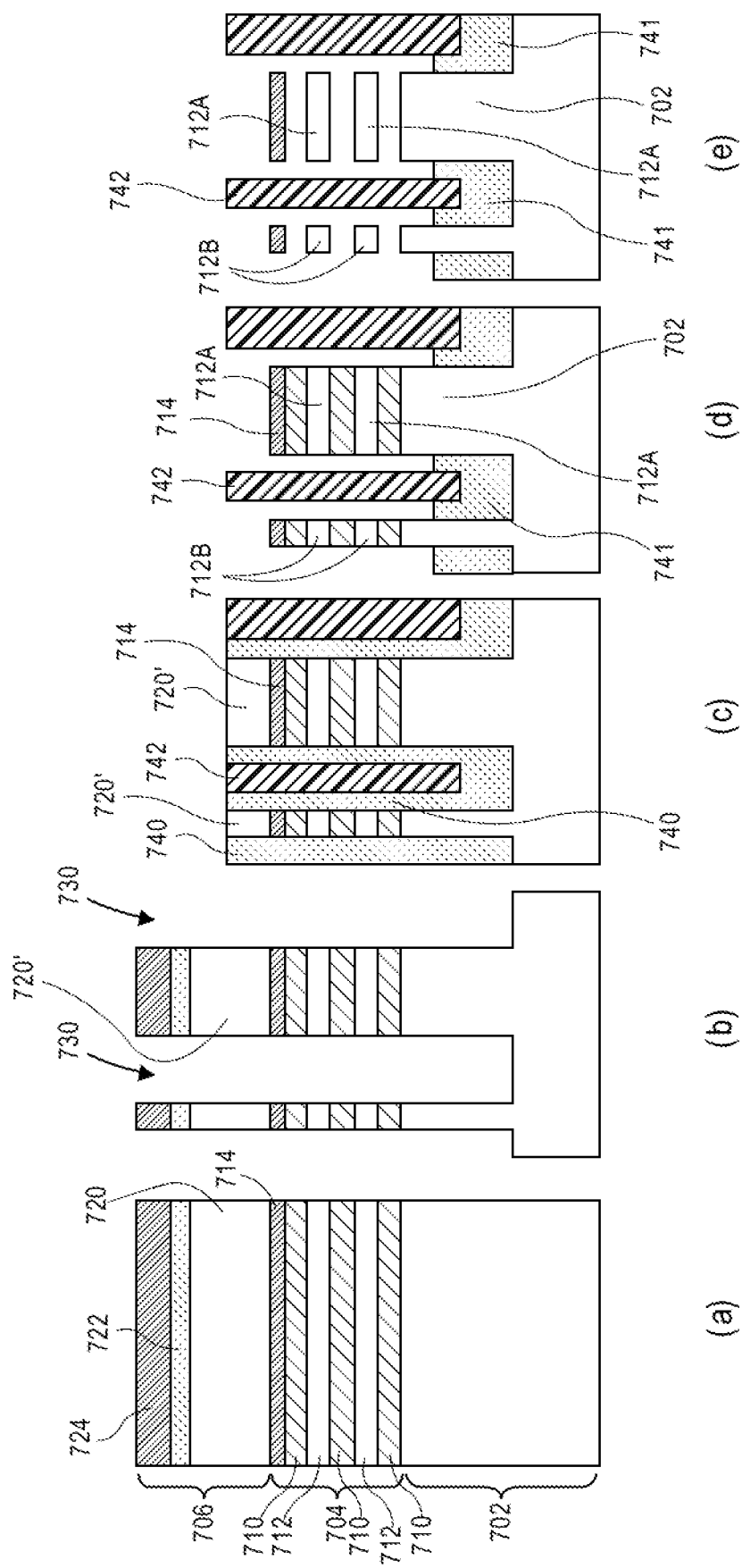
FIG. 7 illustrates cross-sectional views representing various operations in a method of fabricating a self-aligned gate endcap (SAGE) structure with gate-all-around devices, in accordance with an embodiment of the present disclosure.

In an exemplary processing scheme for structures having SAGE walls separating neighboring devices, FIG. 7 illustrates cross-sectional views representing various operations in a method of fabricating a self-aligned gate endcap (SAGE) structure with gate-all-around devices, in accordance with an embodiment of the present disclosure.

Referring to part (a) of FIG. 7, a starting structure includes a nanowire patterning stack 704 above a substrate 702. A lithographic patterning stack 706 is formed above the nanowire patterning stack 704. The nanowire patterning stack 704 includes alternating silicon germanium layers 710 and silicon layers 712. A protective mask 714 is between the nanowire patterning stack 704 and the lithographic patterning stack 706. In one embodiment, the lithographic patterning stack 706 is trilayer mask composed of a topographic masking portion 720, an anti-reflective coating (ARC) layer 722, and a photoresist layer 724. In a particular such embodiment, the topographic masking portion 720 is a carbon hardmask (CHM) layer and the anti-reflective coating layer 722 is a silicon ARC layer.

Referring to part (b) of FIG. 7, the stack of part (a) is lithographically patterned and then etched to provide an etched structure including a patterned substrate 702 and trenches 730.

Referring to part (c) of FIG. 7, the structure of part (b) has an isolation layer 740 and a SAGE material 742 formed in trenches 730. The structure is then planarized to leave patterned topographic masking layer 720' as an exposed upper layer.

Referring to part (d) of FIG. 7, the isolation layer 740 is recessed below an upper surface of the patterned substrate 702, e.g., to define a protruding fin portion and to provide a trench isolation structure 741 beneath SAGE walls 742.

Referring to part (e) of FIG. 7, the silicon germanium layers 710 are removed at least in the channel region to release silicon nanowires 712A and 712B. Subsequent to the formation of the structure of part (e) of FIG. 7, a gate stacks may be formed around nanowires 712B or 712A, over protruding fins of substrate 702, and between SAGE walls 742. In one embodiment, prior to formation of the gate stacks, the remaining portion of protective mask 714 is removed. In another embodiment, the remaining portion of protective mask 714 is retained as an insulating fin hat as an artifact of the processing scheme.

Referring again to part (e) of FIG. 7, it is to be appreciated that a channel view is depicted, with source or drain regions being locating into and out of the page. In an embodiment, the channel region including nanowires 712B has a width less than the channel region including nanowires 712A. Thus, in an embodiment, an integrated circuit structure includes multiple width (multi-Wsi) nanowires. Although structures of 712B and 712A may be differentiated as nanowires and nanoribbons, respectively, both such structures are typically referred to herein as nanowires. It is also to be appreciated that reference to or depiction of a fin/nanowire pair throughout may refer to a structure including a fin and one or more overlying nanowires (e.g., two overlying nanowires are shown in FIG. 7). In accordance with an embodiment of the present disclosure, a fabrication process for structures associated with FIG. 7 involves use of a process scheme that provides a gate-all-around integrated circuit structure having epitaxial nubs, which may be vertically discrete or vertically non-discrete source or drain structures, examples of which are described above in association with FIGS. 1, 2 and 3A-3H.

To highlight an exemplary integrated circuit structure having three vertically arranged nanowires, FIG. 8A illustrates a three-dimensional cross-sectional view of a nanowire-based integrated circuit structure, in accordance with an embodiment of the present disclosure. FIG. 8B illustrates a cross-sectional source or drain view of the nanowire-based integrated circuit structure of FIG. 8A, as taken along the a-a' axis. FIG. 8C illustrates a cross-sectional channel view of the nanowire-based integrated circuit structure of FIG. 8A, as taken along the b-b' axis.

Referring to FIG. 8A, an integrated circuit structure 800 includes one or more vertically stacked nanowires (804 set) above a substrate 802. An optional fin between the bottommost nanowire and the substrate 802 is not depicted for the sake of emphasizing the nanowire portion for illustrative purposes. Embodiments herein are targeted at both single wire devices and multiple wire devices. As an example, a three nanowire-based devices having nanowires 804A, 804B and 804C is shown for illustrative purposes. For convenience of description, nanowire 804A is used as an example where description is focused on one of the nanowires. It is to be appreciated that where attributes of one nanowire are described, embodiments based on a plurality of nanowires may have the same or essentially the same attributes for each of the nanowires.

Each of the nanowires 804 includes a channel region 806 in the nanowire. The channel region 806 has a length (L). Referring to FIG. 8C, the channel region also has a perimeter (Pc) orthogonal to the length (L). Referring to both FIGS. 8A and 8C, a gate electrode stack 808 surrounds the entire perimeter (Pc) of each of the channel regions 806. The gate electrode stack 808 includes a gate electrode along with a gate dielectric layer between the channel region 806 and the gate electrode (not shown). In an embodiment, the channel region is discrete in that it is completely surrounded by the gate electrode stack 808 without any intervening material such as underlying substrate material or overlying channel fabrication materials. Accordingly, in embodiments having a plurality of nanowires 804, the channel regions 806 of the nanowires are also discrete relative to one another. In accordance with an embodiment of the present disclosure, a fabrication process for structures associated with FIGS. 8A-8C involves use of a process scheme that provides a gate-all-around integrated circuit structure having epitaxial nubs, which may be vertically discrete or vertically non-discrete source or drain structures, examples of which are described above in association with FIGS. 1, 2 and 3A-3H.

Referring to both FIGS. 8A and 8B, integrated circuit structure 800 includes a pair of discrete source or drain regions 810/812. The pair of discrete source or drain regions 810/812 is on either side of the channel regions 806 of the plurality of vertically stacked nanowires 804. In an embodiment, as depicted, the source or drain regions 810/812 are discrete in that there are individual and discrete source or drain regions for each channel region 806 of a nanowire 804. Accordingly, in embodiments having a plurality of nanowires 804, the source or drain regions 810/812 of the nanowires are not global or unified source or drain regions but are rather discrete for each nanowire. In one embodiment, from a cross-sectional perspective orthogonal to the length of the discrete channel regions 806, each of the pair of discrete source or drain regions 810/812 is approximately spherical in shape, as depicted in FIGS. 8A and 8B.

In accordance with an embodiment of the present disclosure, and as depicted in FIGS. 8A and 8B, integrated circuit structure 800 further includes a pair of contacts 814, each contact 814 surrounding individual portions of one of the pair of discrete source or drain regions 810/812. In one such embodiment, in a vertical sense, each contact 814 completely surrounds the each of the portions of the discrete source or drain region 810/812. In accordance with an embodiment of the present disclosure, although not depicted, the pair of contacts 814 is an asymmetric pair of contacts, as described in association with FIG. 4J.

Referring to FIGS. 8B and 8C, the discrete source or drain regions 810/812 are non-global in the sense that a single unified feature is not used as a source or drain region for a plurality (in this case, 3) of nanowires 804 and, more particularly, for more than one discrete channel region 806. In an embodiment, the pair of discrete source or drain regions 810/812 is composed of a semiconductor material different than the semiconductor material of the discrete channel regions 806, e.g., the pair of discrete source or drain regions 810/812 is composed of a silicon germanium while the discrete channel regions 806 are composed of silicon. In another embodiment, the pair of discrete source or drain regions 810/812 is composed of a semiconductor material the same or essentially the same as the semiconductor material of the discrete channel regions 806, e.g., both the pair of discrete source or drain regions 810/812 and the discrete channel regions 806 are composed of silicon.

Referring again to FIG. 8A, in an embodiment, integrated circuit structure 800 further includes a pair of spacers 816. As is depicted, outer portions of the pair of spacers 816 may overlap portions of the discrete source or drain regions 810/812, providing for "embedded" portions of the discrete source or drain regions 810/812 beneath the pair of spacers 816. As is also depicted, the embedded portions of the discrete source or drain regions 810/812 may not extend beneath the entirety of the pair of spacers 816.

Substrate 802 may be composed of a material suitable for integrated circuit structure fabrication. In one embodiment, substrate 802 includes a lower bulk substrate composed of a single crystal of a material which may include, but is not limited to, silicon, germanium, silicon-germanium or a III-V compound semiconductor material. An upper insulator layer composed of a material which may include, but is not limited to, silicon dioxide, silicon nitride or silicon oxynitride is on the lower bulk substrate. Thus, the structure 800 may be fabricated from a starting semiconductor-on-insulator substrate. Alternatively, the structure 800 is formed directly from a bulk substrate and local oxidation is used to form electrically insulative portions in place of the above described upper insulator layer. In another alternative embodiment, the structure 800 is formed directly from a bulk substrate and doping is used to form electrically isolated active regions, such as nanowires, thereon. In one such embodiment, the first nanowire (i.e., proximate the substrate) is in the form of an omega-FET type structure.

In an embodiment, the nanowires 804 may be sized as wires or ribbons, as described below, and may have squared-off or rounder corners. In an embodiment, the nanowires 804 are composed of a material such as, but not limited to, silicon, germanium, or a combination thereof. In one such embodiment, the nanowires are single-crystalline. For example, for a silicon nanowire 804, a single-crystalline nanowire may be based from a (100) global orientation, e.g., the z-direction represented by <100>. As described below, other orientations may also be considered. In an embodiment, the dimensions of the nanowires 804, from a cross-sectional perspective, are on the nano-scale. For example, in a specific embodiment, the smallest dimension of the nanowires 804 is less than approximately 20 nanometers. In an embodiment, the nanowires 804 are composed of a strained material, particularly in the channel regions 806. In an embodiment, a (110) plane wafer is used where the z-direction is <110> is also desirable particularly for nanoribbon (equivalently called nanosheets). In an embodiment, the conduction direction is <110>.

Referring to FIGS. 8C, in an embodiment, each of the channel regions 806 has a width (Wc) and a height (Hc), the width (Wc) approximately the same as the height (Hc). That is, in both cases, the channel regions 806 are square-like or, if corner-rounded, circle-like in cross-section profile. In another aspect, the width and height of the channel region need not be the same, such as the case for nanoribbons as described throughout.

In another aspect, methods of fabricating a nanowire portion of a fin/nanowire integrated circuit structure are provided. For example, FIGS. 9A-9E illustrate three-dimensional cross-sectional views representing various operations in a method of fabricating a nanowire portion of a fin/nanowire structure, in accordance with an embodiment of the present disclosure.

Figure 9A:
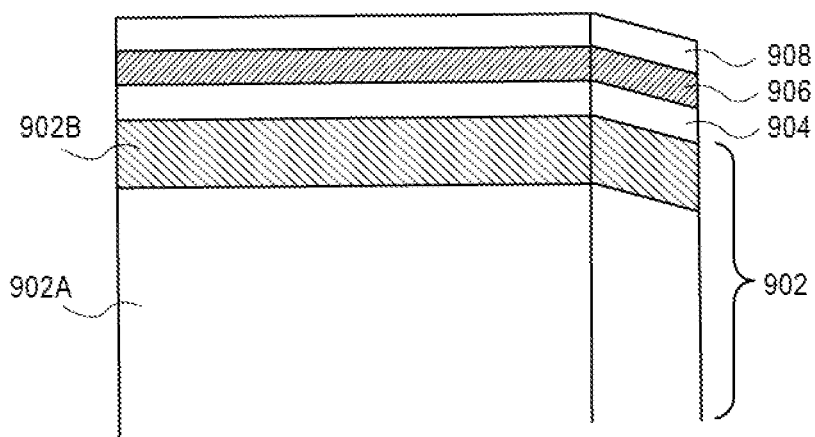
FIGS. 9A-9E illustrate three-dimensional cross-sectional views representing various operations in a method of fabricating a nanowire portion of a fin/nanowire structure, in accordance with an embodiment of the present disclosure.

A method of fabricating a nanowire integrated circuit structure may include forming a nanowire above a substrate. In a specific example showing the formation of two silicon nanowires, FIG. 9A illustrates a substrate 902 (e.g., composed of a bulk substrate silicon substrate 902A with an insulating silicon dioxide layer 902B there on) having a silicon layer 904/silicon germanium layer 906/silicon layer 908 stack thereon. It is to be understood that, in another embodiment, a silicon germanium layer/silicon layer/silicon germanium layer stack may be used to ultimately form two silicon germanium nanowires.

Figure 9B:
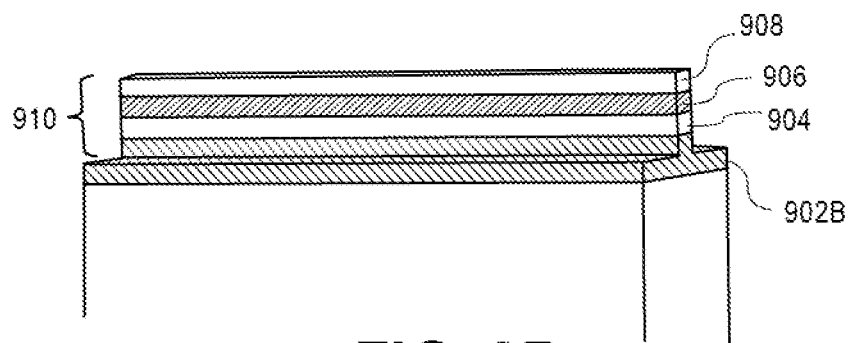

Referring to FIG. 9B, a portion of the silicon layer 904/silicon germanium layer 906/silicon layer 908 stack as well as a top portion of the silicon dioxide layer 902B is patterned into a fin-type structure 910, e.g., with a mask and plasma etch process. It is to be appreciated that, for illustrative purposes, the etch for FIG. 9B is shown as forming two silicon nanowire precursor portions. Although the etch is shown for ease of illustration as ending within a bottom isolation layer, more complex stacks are contemplated within the context of embodiments of the present disclosure. For example, the process may be applied to a nanowire/fin stack as described in association with FIG. 7.

Figure 9C:
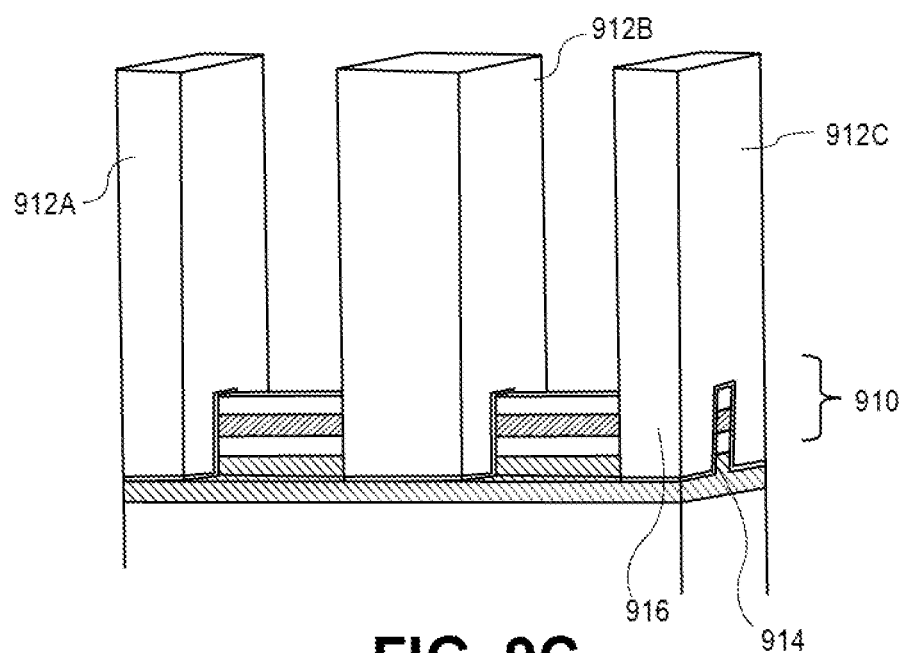

The method may also include forming a channel region in the nanowire, the channel region having a length and a perimeter orthogonal to the length. In a specific example showing the formation of three gate structures over the two silicon nanowires, FIG. 9C illustrates the fin-type structure 910 with three sacrificial gates 912A, 912B, and 912C thereon. In one such embodiment, the three sacrificial gates 912A, 912B, and 912C are composed of a sacrificial gate oxide layer 914 and a sacrificial polysilicon gate layer 916 which are blanket deposited and patterned with a plasma etch process.

Figure 9D:
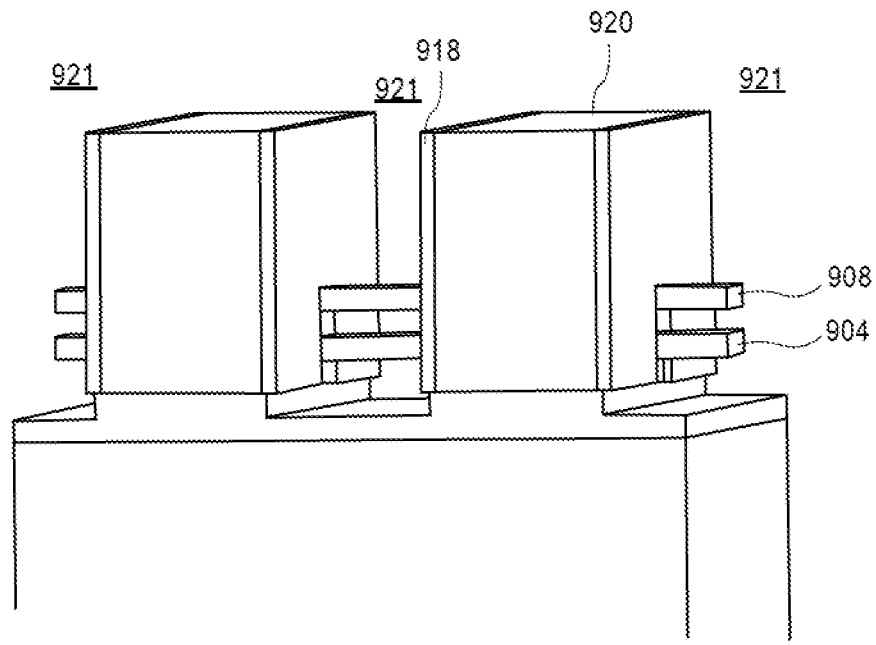

Following patterning to form the three sacrificial gates 912A, 912B, and 912C, a fabrication process is performed that provides a gate-all-around integrated circuit structure having a depopulated channel structure, examples of which are described above in association with FIG. 1, FIG. 2 and FIGS. 3A-3H. Following such a channel structure depopulation process, spacers may be formed on the sidewalls of the three sacrificial gates 912A, 912B, and 912C, doping may be performed (e.g., tip and/or source and drain type doping), and an interlayer dielectric layer may be formed to cover the three sacrificial gates 912A, 912B, and 912C. The interlayer dielectric layer may be polished to expose the three sacrificial gates 912A, 912B, and 912C for a replacement gate, or gate-last, process. Referring to FIG. 9D, the three sacrificial gates 912A, 912B, and 912C have been removed, leaving spacers 918 and a portion of the interlayer dielectric layer 920 remaining.

Additionally, referring again to FIG. 9D the portions of the silicon germanium layer 906 and the portion of the insulating silicon dioxide layer 902B of the fin structure 910 are removed in the regions originally covered by the three sacrificial gates 912A, 912B, and 912C. Discrete portions of the silicon layers 904 and 908 thus remain, as depicted in FIG. 9D.

The discrete portions of the silicon layers 904 and 908 shown in FIG. 9D will, in one embodiment, ultimately become channel regions in a nanowire-based device. Thus, at the process stage depicted in FIG. 9D, channel engineering or tuning may be performed. For example, in one embodiment, the discrete portions of the silicon layers 904 and 908 shown in FIG. 9D are thinned using oxidation and etch processes. Such an etch process may be performed at the same time the wires are separated by etching the silicon germanium layer 906. Accordingly, the initial wires formed from silicon layers 904 and 908 begin thicker and are thinned to a size suitable for a channel region in a nanowire device, independent from the sizing of the source and drain regions of the device. Thus, in an embodiment, forming the channel region includes removing a portion of the nanowire, and the resulting perimeters of the source and drain regions (described below) are greater than the perimeter of the resulting channel region.

Figure 9E:
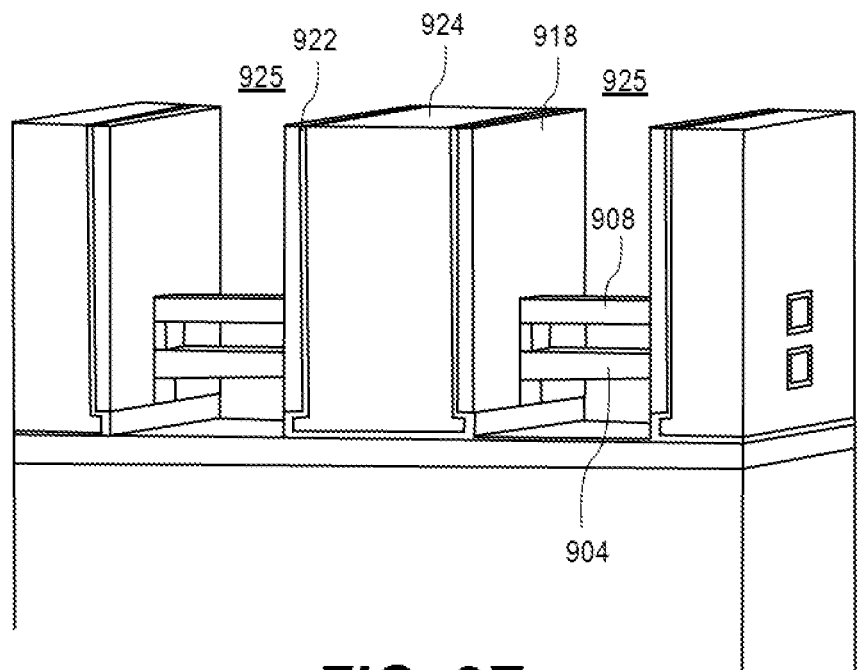

The method may also include forming a gate electrode stack surrounding the entire perimeter of the channel region. In the specific example showing the formation of three gate structures over the two silicon nanowires, FIG. 9E illustrates the structure following deposition of a gate dielectric layer 922 (such as a high-k gate dielectric layer) and a gate electrode layer 924 (such as a metal gate electrode layer), and subsequent polishing, in between the spacers 918. That is, gate structures are formed in the trenches 921 of FIG. 9D. Additionally, FIG. 9E depicts the result of the subsequent removal of the interlayer dielectric layer 920 after formation of the permanent gate stack. The portions of the silicon germanium layer 906 and the portion of the insulating silicon dioxide layer 902B of the fin structure 910 are also removed in the regions originally covered by the portion of the interlayer dielectric layer 920 depicted in FIG. 9D. Discrete portions of the silicon layers 904 and 908 thus remain, as depicted in FIG. 9E.

The method may also include forming a pair of source and drain regions in the nanowire, on either side of the channel region. In an embodiment, the source or drain regions are formed by removing portions of nanowires 904 and 908 and then performing source or drain (S/D) growth. In accordance with an embodiment of the present disclosure, such epitaxial source or drain structures are or include epitaxial nubs, which may be vertically discrete or vertically non-discrete source or drain structures, examples of which are described above in association with FIGS. 1, 2 and 3A-3H.

The method may subsequently include forming a pair of contacts, a first of the pair of contacts completely or nearly completely surrounding the perimeter of the source region, and a second of the pair of contacts completely or nearly completely surrounding the perimeter of the drain region. In an embodiment, the pair of contacts is an asymmetric pair of source and drain contact structures, such as described in association with FIG. 4J. In other embodiments, the pair of contacts is a symmetric pair of source and drain contact structures. Specifically, contacts are formed in the trenches 925 of FIG. 9E following epitaxial growth. One of the trenches may first be recessed further than the other of the trenches. In an embodiment, the contacts are formed from a metallic species. In one such embodiment, the metallic species is formed by conformally depositing a contact metal and then filling any remaining trench volume. The conformal aspect of the deposition may be performed by using chemical vapor deposition (CVD), atomic layer deposition (ALD), or metal reflow.

In an embodiment, as described throughout, an integrated circuit structure includes non-planar devices such as, but not limited to, a finFET or a tri-gate device with corresponding one or more overlying nanowire structures. In such an embodiment, a corresponding semiconducting channel region is composed of or is formed in a three-dimensional body with one or more discrete nanowire channel portions overlying the three-dimensional body. In one such embodiment, the gate structures surround at least a top surface and a pair of sidewalls of the three-dimensional body, and further surrounds each of the one or more discrete nanowire channel portions.

In an embodiment, as described throughout, a substrate may be composed of a semiconductor material that can withstand a manufacturing process and in which charge can migrate. In an embodiment, the substrate is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a III-V material and the charge-carrier dopant impurity atoms are ones such as, but not limited to, carbon, silicon, germanium, oxygen, sulfur, selenium or tellurium.

In an embodiment, as described throughout, a trench isolation layer may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, a trench isolation layer is composed of a dielectric material such as, but not limited to, silicon dioxide, silicon oxy-nitride, silicon nitride, or carbon-doped silicon nitride.

In an embodiment, as described throughout, self-aligned gate endcap isolation structures may be composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 10:
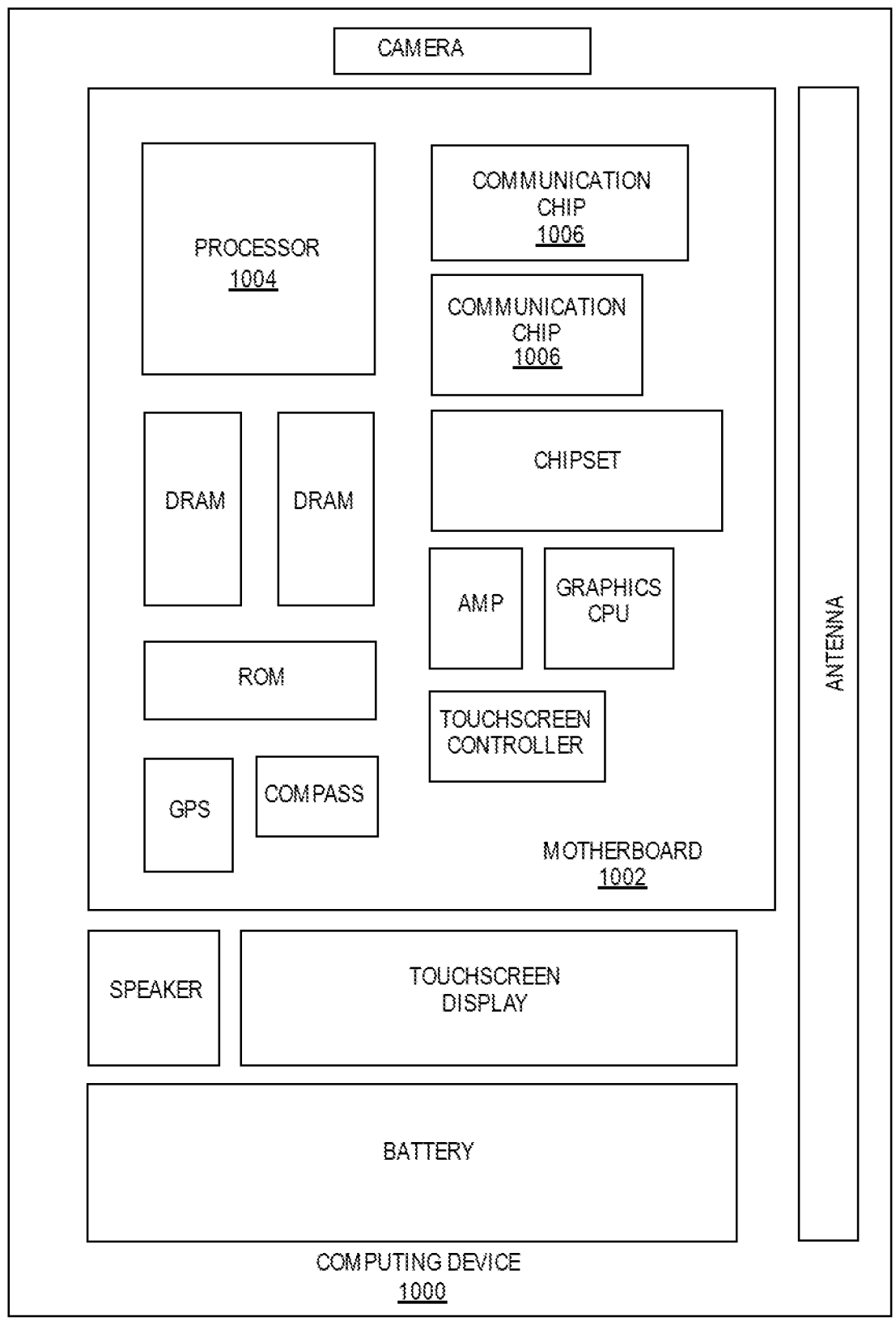
FIG. 10 illustrates a computing device in accordance with one implementation of an embodiment of the disclosure.

FIG. 10 illustrates a computing device 1000 in accordance with one implementation of an embodiment of the present disclosure. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. The integrated circuit die of the processor 1004 may include one or more structures, such as gate-all-around integrated circuit structures having source or drain structures with epitaxial nubs built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. The integrated circuit die of the communication chip 1006 may include one or more structures, such as gate-all-around integrated circuit structures having source or drain structures with epitaxial nubs built in accordance with implementations of embodiments of the present disclosure.

In further implementations, another component housed within the computing device 1000 may contain an integrated circuit die that includes one or structures, such as gate-all-around integrated circuit structures having source or drain structures with epitaxial nubs built in accordance with implementations of embodiments of the present disclosure.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Figure 11:
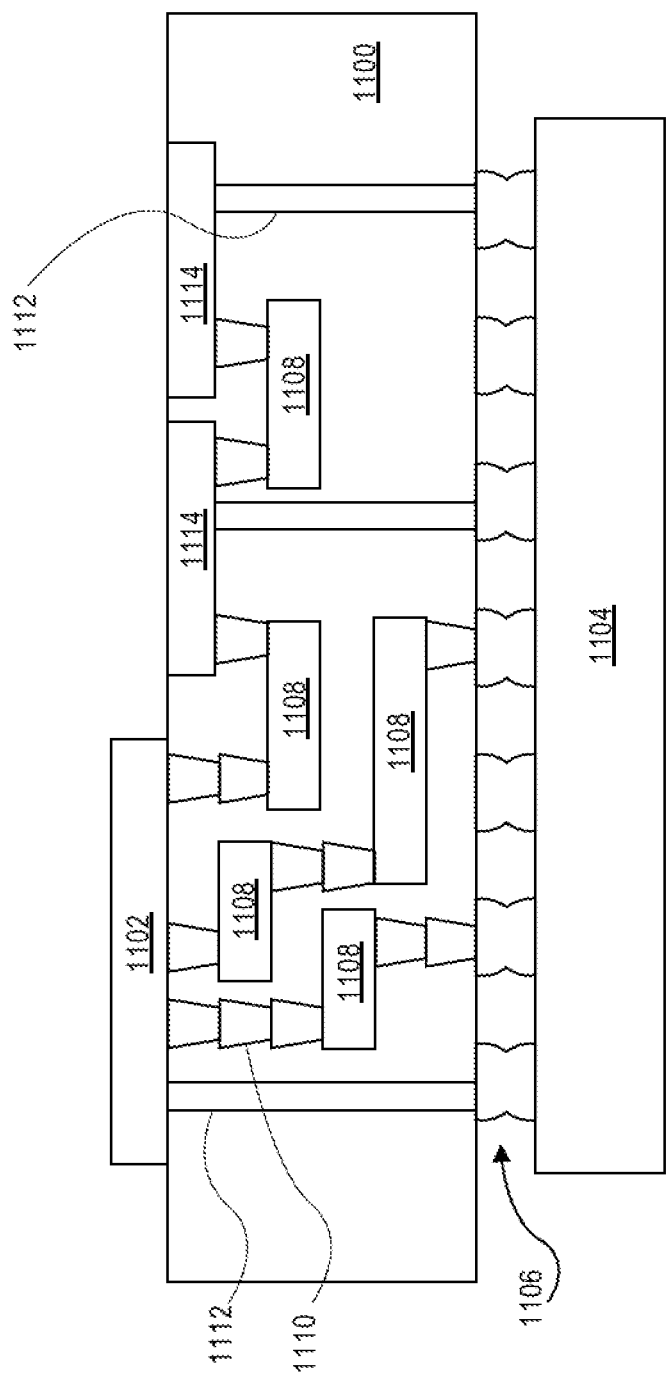
FIG. 11 illustrates an interposer that includes one or more embodiments of the disclosure.

FIG. 11 illustrates an interposer 1100 that includes one or more embodiments of the present disclosure. The interposer 1100 is an intervening substrate used to bridge a first substrate 1102 to a second substrate 1104. The first substrate 1102 may be, for instance, an integrated circuit die. The second substrate 1104 may be, for instance, a memory module, a computer motherboard, or another integrated circuit die. Generally, the purpose of an interposer 1100 is to spread a connection to a wider pitch or to reroute a connection to a different connection. For example, an interposer 1100 may couple an integrated circuit die to a ball grid array (BGA) 1106 that can subsequently be coupled to the second substrate 1104. In some embodiments, the first and second substrates 1102/1104 are attached to opposing sides of the interposer 1100. In other embodiments, the first and second substrates 1102/1104 are attached to the same side of the interposer 1100. And in further embodiments, three or more substrates are interconnected by way of the interposer 1100.

The interposer 1100 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1108 and vias 1110, including but not limited to through-silicon vias (TSVs) 1112. The interposer 1100 may further include embedded devices 1114, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1100. In accordance with embodiments of the disclosure, apparatuses or processes disclosed herein may be used in the fabrication of interposer 1100 or in the fabrication of components included in the interposer 1100.

Thus, embodiments of the present disclosure include gate-all-around integrated circuit structures having source or drain structures with epitaxial nubs, and methods of fabricating gate-all-around integrated circuit structures having source or drain structures with epitaxial nubs.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a first vertical arrangement of horizontal nanowires and a second vertical arrangement of horizontal nanowires. A first gate stack is around the first vertical arrangement of horizontal nanowires, and a second gate stack is around the second vertical arrangement of horizontal nanowires. A first pair of epitaxial source or drain structures is at first and second ends of the first vertical arrangement of horizontal nanowires, the first pair of epitaxial source or drain structures including vertically discrete portions aligned with the first vertical arrangement of horizontal nanowires. A second pair of epitaxial source or drain structures is at first and second ends of the second vertical arrangement of horizontal nanowires, the second pair of epitaxial source or drain structures including vertically discrete portions aligned with the second vertical arrangement of horizontal nanowires. One of the first pair of epitaxial source or drain structures is laterally adjacent to but not merged with one of the second pair of epitaxial source or drain structures. A conductive contact structure is laterally between and in contact with the one of the first pair of epitaxial source or drain structures and the one of the second pair of epitaxial source or drain structures.

Example embodiment 2: The integrated circuit structure of example embodiment 1, wherein the conductive contact structure surrounds the vertically discrete portions of the first pair of epitaxial source or drain structures and surrounds the vertically discrete portions of the second pair of epitaxial source or drain structures.

Example embodiment 3: The integrated circuit structure of example embodiment 1 or 2, further including a first sub-fin structure beneath the first vertical arrangement of horizontal nanowires, and a second sub-fin structure beneath the second vertical arrangement of horizontal nanowires.

Example embodiment 4: The integrated circuit structure of example embodiment 1, 2 or 3, wherein one of the first and second pairs of epitaxial source or drain structures is a pair of compressive-stressing source or drain structures.

Example embodiment 5: The integrated circuit structure of example embodiment 1, 2 or 3, wherein one of the first and second pairs of epitaxial source or drain structures is a pair of tensile-stressing source or drain structures.

Example embodiment 6: The integrated circuit structure of example embodiment 1, 2, 3, 4 or 5, wherein one of the first and second gate stacks includes a high-k gate dielectric layer and a metal gate electrode.

Example embodiment 7: A method of fabricating an integrated circuit structure includes forming a first vertical arrangement of horizontal nanowires and a second vertical arrangement of horizontal nanowires. The method also includes forming a first dummy gate stack over the first vertical arrangement of horizontal nanowires, and a second dummy gate stack over the second vertical arrangement of horizontal nanowires. The method also includes forming a first pair of epitaxial source or drain structures at first and second ends of the first vertical arrangement of horizontal nanowires, the first pair of epitaxial source or drain structures including vertically discrete portions aligned with the first vertical arrangement of horizontal nanowires. The method also includes forming a second pair of epitaxial source or drain structures at first and second ends of the second vertical arrangement of horizontal nanowires, the second pair of epitaxial source or drain structures including vertically discrete portions aligned with the second vertical arrangement of horizontal nanowires. One of the first pair of epitaxial source or drain structures is laterally adjacent to but not merged with one of the second pair of epitaxial source or drain structures. The method also includes forming a dummy contact structure between and in contact with the one of the first pair of epitaxial source or drain structures and the one of the second pair of epitaxial source or drain structures. The method also includes, subsequent to forming the dummy contact structure, replacing the first and second dummy gate stacks with first and second permanent gate stacks, respectively. The method also includes, subsequent to replacing the first and second dummy gate stacks with the first and second permanent gate stacks, removing the dummy contact structure. The method also includes forming a conductive contact structure laterally between and in contact with the one of the first pair of epitaxial source or drain structures and the one of the second pair of epitaxial source or drain structures.

Example embodiment 8: The method of example embodiment 7, wherein the conductive contact structure surrounds the vertically discrete portions of the first pair of epitaxial source or drain structures and surrounds the vertically discrete portions of the second pair of epitaxial source or drain structures.

Example embodiment 9: The method of example embodiment 7 or 8, wherein one of the first and second pairs of epitaxial source or drain structures is a pair of compressive-stressing source or drain structures.

Example embodiment 10: The method of example embodiment 7 or 8, wherein one of the first and second pairs of epitaxial source or drain structures is a pair of tensile-stressing source or drain structures.

Example embodiment 11: The method of example embodiment 7, 8 or 9, wherein one of the first and second permanent gate stacks includes a high-k gate dielectric layer and a metal gate electrode.

Example embodiment 12: An integrated circuit structure includes a first vertical arrangement of horizontal nanowires and a second vertical arrangement of horizontal nanowires. A first gate stack is around the first vertical arrangement of horizontal nanowires, and a second gate stack is around the second vertical arrangement of horizontal nanowires. A first pair of epitaxial source or drain structures is at first and second ends of the first vertical arrangement of horizontal nanowires, the first pair of epitaxial source or drain structures including vertically non-discrete portions aligned with the first vertical arrangement of horizontal nanowires. A second pair of epitaxial source or drain structures is at first and second ends of the second vertical arrangement of horizontal nanowires, the second pair of epitaxial source or drain structures including vertically non-discrete portions aligned with the second vertical arrangement of horizontal nanowires. One of the first pair of epitaxial source or drain structures is laterally adjacent to but not merged with one of the second pair of epitaxial source or drain structures. A conductive contact structure is laterally between and in contact with the one of the first pair of epitaxial source or drain structures and the one of the second pair of epitaxial source or drain structures.

Example embodiment 13: The integrated circuit structure of example embodiment 12, further including a first sub-fin structure beneath the first vertical arrangement of horizontal nanowires, and a second sub-fin structure beneath the second vertical arrangement of horizontal nanowires.

Example embodiment 14: The integrated circuit structure of example embodiment 12 or 13, wherein one of the first and second pairs of epitaxial source or drain structures is a pair of compressive-stressing source or drain structures.

Example embodiment 15: The integrated circuit structure of example embodiment 12 or 13, wherein one of the first and second pairs of epitaxial source or drain structures is a pair of tensile-stressing source or drain structures.

Example embodiment 16: The integrated circuit structure of example embodiment 12, 13, 14 or 15, wherein one of the first and second gate stacks includes a high-k gate dielectric layer and a metal gate electrode.

Example embodiment 17: A method of fabricating an integrated circuit structure includes forming a first vertical arrangement of horizontal nanowires and a second vertical arrangement of horizontal nanowires. The method also includes forming a first dummy gate stack over the first vertical arrangement of horizontal nanowires, and a second dummy gate stack over the second vertical arrangement of horizontal nanowires. The method also includes forming a first pair of epitaxial source or drain structures at first and second ends of the first vertical arrangement of horizontal nanowires, the first pair of epitaxial source or drain structures including vertically non-discrete portions aligned with the first vertical arrangement of horizontal nanowires. The method also includes forming a second pair of epitaxial source or drain structures at first and second ends of the second vertical arrangement of horizontal nanowires, the second pair of epitaxial source or drain structures including vertically non-discrete portions aligned with the second vertical arrangement of horizontal nanowires. One of the first pair of epitaxial source or drain structures is laterally adjacent to but not merged with one of the second pair of epitaxial source or drain structures. The method also includes forming a dummy contact structure between and in contact with the one of the first pair of epitaxial source or drain structures and the one of the second pair of epitaxial source or drain structures. The method also includes, subsequent to forming the dummy contact structure, replacing the first and second dummy gate stacks with first and second permanent gate stacks, respectively. The method also includes, subsequent to replacing the first and second dummy gate stacks with the first and second permanent gate stacks, removing the dummy contact structure. The method also includes forming a conductive contact structure laterally between and in contact with the one of the first pair of epitaxial source or drain structures and the one of the second pair of epitaxial source or drain structures.

Example embodiment 18: The method of example embodiment 17, wherein one of the first and second pairs of epitaxial source or drain structures is a pair of compressive-stressing source or drain structures.

Example embodiment 19: The method of example embodiment 17, wherein one of the first and second pairs of epitaxial source or drain structures is a pair of tensile-stressing source or drain structures.

Example embodiment 20: The method of example embodiment 17, 18 or 19, wherein one of the first and second permanent gate stacks includes a high-k gate dielectric layer and a metal gate electrode.

What is claimed is:

1. An integrated circuit structure, comprising:
    a first horizontal nanowire above a second horizontal nanowire;
    a gate stack around the first and second horizontal nanowires;
    a first epitaxial source or drain structure at a first end of the first and second horizontal nanowires, the first epitaxial source or drain structure comprising a first portion aligned with the first horizontal nanowire, and a second portion aligned with the second horizontal nanowire, the second portion discrete from the first portion;
    a second epitaxial source or drain structure at a second end of the first and second horizontal nanowires, the second epitaxial source or drain structure comprising a first portion aligned with the first horizontal nanowire, and a second portion aligned with the second horizontal nanowire, the second portion discrete from the first portion; and
    a conductive contact structure laterally adjacent to and in contact with the first and second portions of the first epitaxial source or drain structure, wherein the conductive contact is continuous vertically between the first and second portions of the first epitaxial source or drain structure.

2. The integrated circuit structure of claim 1, wherein the conductive contact structure surrounds the first and second portions of the first epitaxial source or drain structure.

3. The integrated circuit structure of claim 1, further comprising:
    a sub-fin structure beneath the second horizontal nanowire.

4. The integrated circuit structure of claim 1, wherein the first and second epitaxial source or drain structures are compressive-stressing source or drain structures.

5. The integrated circuit structure of claim 1, wherein the first and second epitaxial source or drain structures are tensile-stressing source or drain structures.

6. The integrated circuit structure of claim 1, wherein the gate stack comprises a high-k gate dielectric layer and a metal gate electrode.

7. A method of fabricating an integrated circuit structure, the method comprising:
    forming a first horizontal nanowire above a second horizontal nanowire;
    forming a gate stack around the first and second horizontal nanowires;
    forming a first epitaxial source or drain structure at a first end of the first and second horizontal nanowires, the first epitaxial source or drain structure comprising a first portion aligned with the first horizontal nanowire, and a second portion aligned with the second horizontal nanowire, the second portion discrete from the first portion;
    forming a second epitaxial source or drain structure at a second end of the first and second horizontal nanowires, the second epitaxial source or drain structure comprising a first portion aligned with the first horizontal nanowire, and a second portion aligned with the second horizontal nanowire, the second portion discrete from the first portion; and
    forming a conductive contact structure laterally adjacent to and in contact with the first and second portions of the first epitaxial source or drain structure, wherein the conductive contact is continuous vertically between the first and second portions of the first epitaxial source or drain structure.

8. The method of claim 7, wherein the conductive contact structure surrounds the first and second portions of the first epitaxial source or drain structure.

9. The method of claim 7, wherein the first and second epitaxial source or drain structures are compressive-stressing source or drain structures.

10. The method of claim 7, wherein the first and second epitaxial source or drain structures are tensile-stressing source or drain structures.

11. The method of claim 7, wherein the gate stack comprises a high-k gate dielectric layer and a metal gate electrode.

12. A computing device, comprising:
a board; and
a component coupled to the board, the component including an integrated circuit structure, comprising:
 a first horizontal nanowire above a second horizontal nanowire;
 a gate stack around the first and second horizontal nanowires;
 a first epitaxial source or drain structure at a first end of the first and second horizontal nanowires, the first epitaxial source or drain structure comprising a first portion aligned with the first horizontal nanowire, and a second portion aligned with the second horizontal nanowire, the second portion discrete from the first portion;
 a second epitaxial source or drain structure at a second end of the first and second horizontal nanowires, the second epitaxial source or drain structure comprising a first portion aligned with the first horizontal nanowire, and a second portion aligned with the second horizontal nanowire, the second portion discrete from the first portion; and
 a conductive contact structure laterally adjacent to and in contact with the first and second portions of the first epitaxial source or drain structure, wherein the conductive contact is continuous vertically between the first and second portions of the first epitaxial source or drain structure.

13. The computing device of claim 12, further comprising:
a memory coupled to the board.

14. The computing device of claim 12, further comprising:
a communication chip coupled to the board.

15. The computing device of claim 12, further comprising:
a battery coupled to the board.

16. The computing device of claim 12, further comprising:
a camera coupled to the board.

17. The computing device of claim 12, further comprising:
a GPS coupled to the board.

18. The computing device of claim 12, further comprising:
a compass coupled to the board.

19. The computing device of claim 12, wherein the component is a packaged integrated circuit die.

20. The computing device of claim 12, wherein the component is selected from the group consisting of a processor, a communications chip, and a digital signal processor.

* * * * *